US012588245B2

(12) United States Patent
Liaw

(10) Patent No.: US 12,588,245 B2
(45) Date of Patent: Mar. 24, 2026

(54) METHOD FOR MANUFACTURING FOR FORMING SOURCE/DRAIN CONTACT FEATURES AND DEVICES MANUFACTURED THEREOF

(71) Applicant: TAIWAN SEMICONDUCTOR MANUFACTURING COMPANY, LTD., Hsinchu (TW)

(72) Inventor: Jhon Jhy Liaw, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 442 days.

(21) Appl. No.: 18/104,836

(22) Filed: Feb. 2, 2023

(65) Prior Publication Data

US 2024/0266407 A1 Aug. 8, 2024

(51) Int. Cl.

| | |
|---|---|
| *H10D 84/00* | (2025.01) |
| *H10D 30/67* | (2025.01) |
| *H10D 62/10* | (2025.01) |
| *H10D 64/01* | (2025.01) |
| *H10D 84/01* | (2025.01) |
| *H10D 84/03* | (2025.01) |

(52) U.S. Cl.

CPC ..... *H10D 30/6729* (2025.01); *H10D 30/6735* (2025.01); *H10D 30/6757* (2025.01); *H10D 62/121* (2025.01); *H10D 64/021* (2025.01); *H10D 84/017* (2025.01); *H10D 84/0184* (2025.01); *H10D 84/0193* (2025.01); *H10D 84/038* (2025.01)

(58) Field of Classification Search

CPC ............ H10D 30/6735; H10D 62/121; H10D 84/017; H10D 64/017; H10D 64/021

See application file for complete search history.

(56) References Cited

U.S. PATENT DOCUMENTS

| | | | |
|---|---|---|---|
| 9,105,490 | B2 | 8/2015 | Wang et al. |
| 9,236,267 | B2 | 1/2016 | De et al. |
| 9,236,300 | B2 | 1/2016 | Liaw |
| 9,406,804 | B2 | 8/2016 | Huang et al. |
| 9,443,769 | B2 | 9/2016 | Wang et al. |

(Continued)

FOREIGN PATENT DOCUMENTS

| | | | |
|---|---|---|---|
| TW | 202243243 | A | 11/2022 |
| WO | 2022117565 | A1 | 6/2022 |

*Primary Examiner* — Reema Patel

(74) *Attorney, Agent, or Firm* — HAYNES AND BOONE, LLP

(57) ABSTRACT

The present disclosure relates to methods for forming self-aligned source/drain contacts with increased contact size while maintaining the reliability margin between source/drain contacts and gate electrodes. Semiconductor devices according to the present disclosure has contact landing Rc reduction at source/drain contacts as well as device performance improvement. The source/drain contacts formed according to the present disclosure also has lowered height leading to the capacitance reduction of between the source/drain contact to gate electrode. Embodiments of the present disclosure also provides improvements in circuit density and process margin. The self-aligned contact scheme according to the present disclosure allow more aggressive gate pitch (CPP) scaling and also maintain the landing area as well as contact-gate isolation margin.

20 Claims, 35 Drawing Sheets

(56) References Cited

U.S. PATENT DOCUMENTS

| | | | |
|---|---|---|---|
| 9,520,482 | B1 | 12/2016 | Chang et al. |
| 9,548,366 | B1 | 1/2017 | Ho et al. |
| 9,576,814 | B2 | 2/2017 | Wu et al. |
| 9,831,183 | B2 | 11/2017 | Lin et al. |
| 9,859,386 | B2 | 1/2018 | Ho et al. |
| 10,373,877 | B1 | 8/2019 | Wang et al. |
| 10,950,731 | B1 * | 3/2021 | Peng ...................... H10D 30/43 |
| 2016/0111430 | A1 | 4/2016 | Liaw |
| 2017/0110549 | A1 * | 4/2017 | Xie .................... H10D 30/6219 |
| 2020/0035820 | A1 | 1/2020 | Zhang et al. |
| 2020/0075719 | A1 | 3/2020 | Cheng et al. |
| 2020/0083090 | A1 | 3/2020 | Chan et al. |
| 2021/0343597 | A1 * | 11/2021 | Ko ....................... H10D 62/151 |
| 2022/0093757 | A1 | 3/2022 | Huang et al. |
| 2022/0165885 | A1 | 5/2022 | Liao et al. |
| 2022/0271130 | A1 * | 8/2022 | Su ........................ H10D 84/038 |
| 2023/0010952 | A1 | 1/2023 | Chen et al. |

* cited by examiner

100

118 Form source/drain contacts

120 Perform CMP to the gate electrode and expose the sidewall spacers 122 deposit a second ILD layer and Form contact vias in the second ILD layers 102 Form fin structures 104 form sacrificial gate structures and spacers 106 Form source/drain regions 108 Form a contact etch stop layer (CESL) and a first inter-layer dielectric (ILD) layer over the source/drain regions 110 Etch a portion of sidewall spacers 112 Remove sacrificial gate structures 114 Form replacement gate structures covering the sidewall spacers 116 Form contact openings extending through the first ILD layer

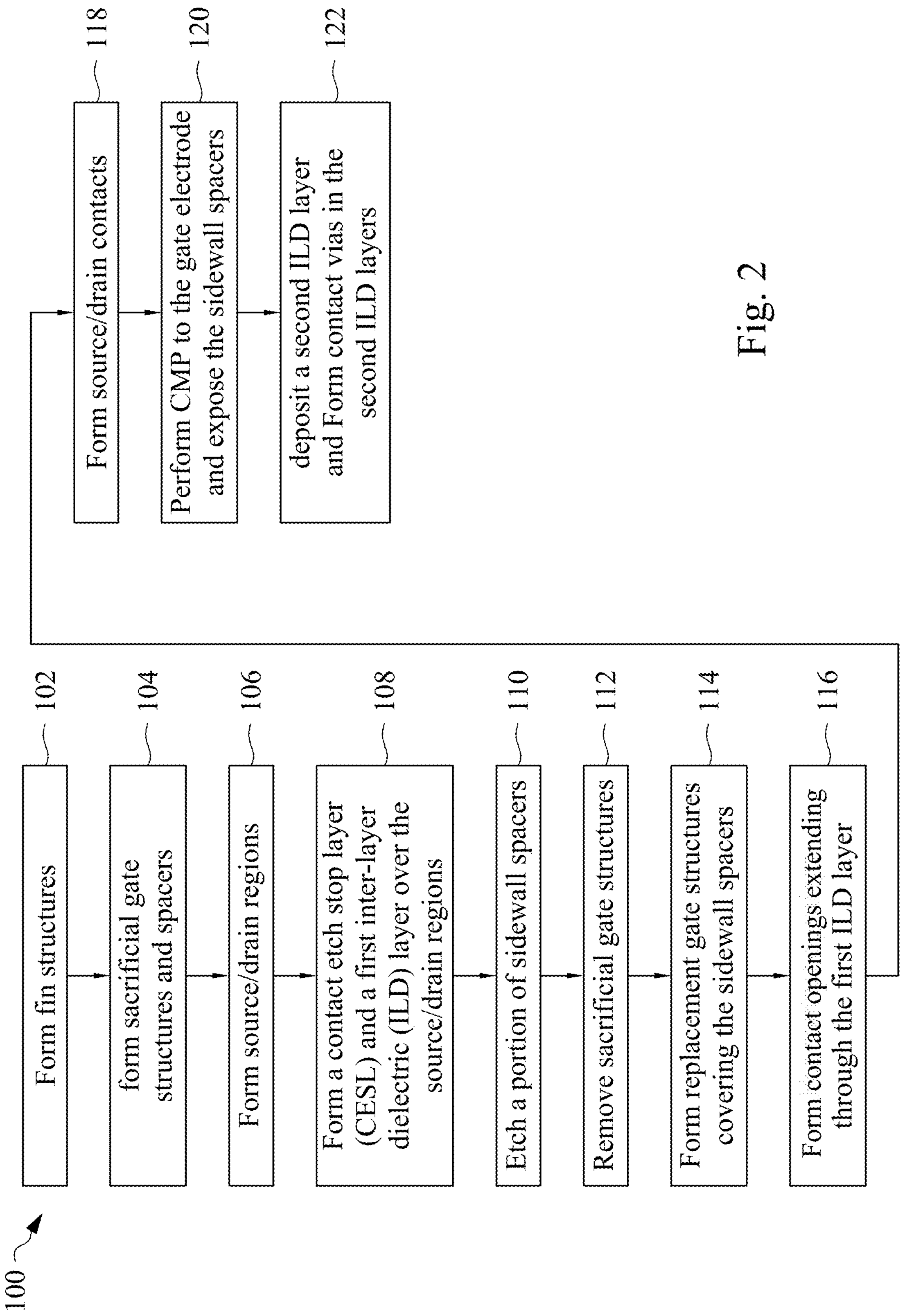

Fig. 2

METHOD FOR MANUFACTURING FOR FORMING SOURCE/DRAIN CONTACT FEATURES AND DEVICES MANUFACTURED THEREOF

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density, i.e., the number of interconnected devices per chip area, has generally increased while geometric size, i.e., the smallest component that can be created using a fabrication process, has decreased. Such advances have increased the complexity of manufacturing and processing ICs; similar developments in IC processing and manufacturing are being developed to meet this progress.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a flow chart of a method for manufacturing of a semiconductor device according to embodiments of the present disclosure.

DETAILED DESCRIPTION

Figure 1A:
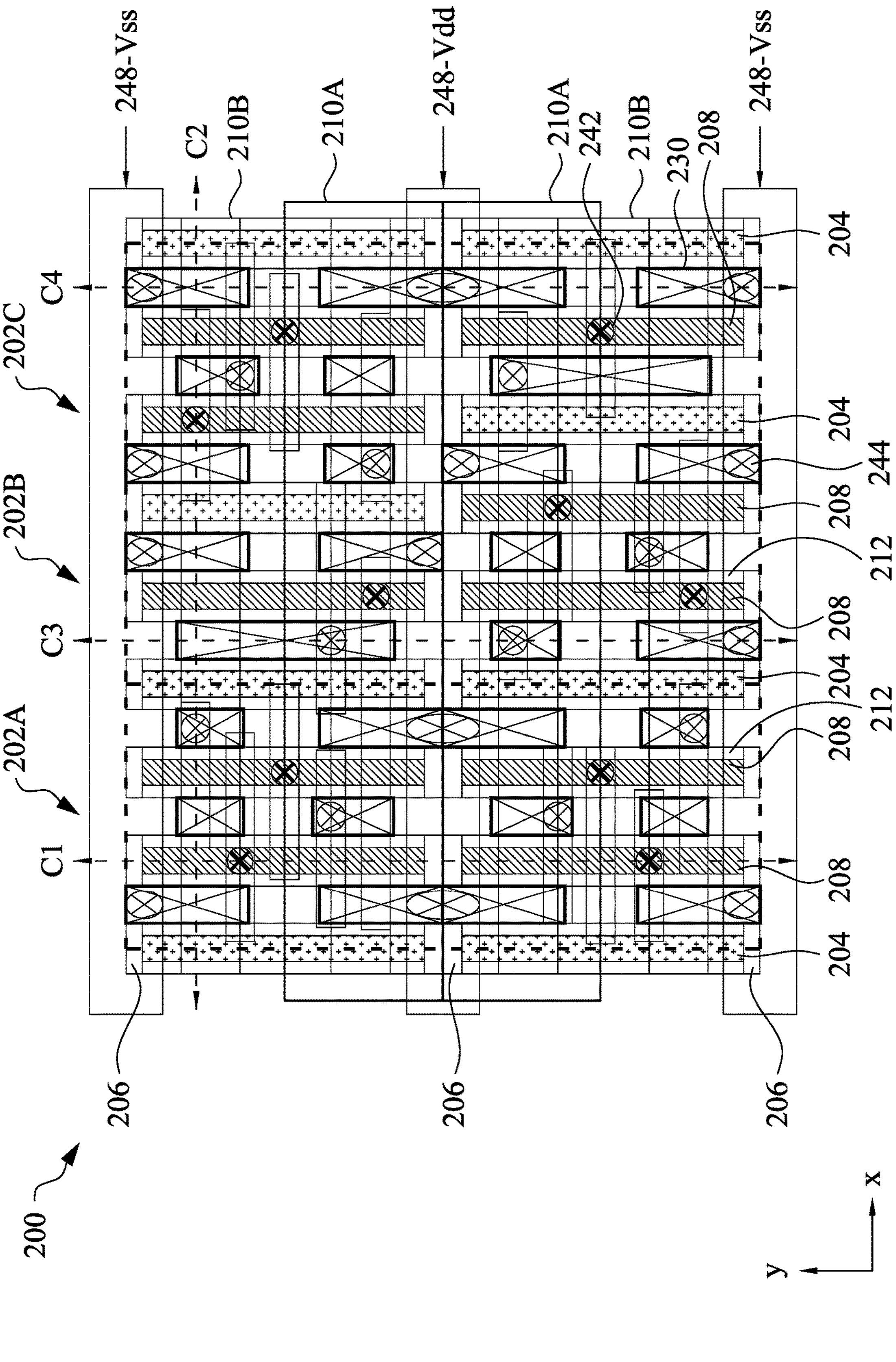
FIG. 1A is a schematic layout view of a semiconductor device according to embodiments of the present disclosure.
Figure 1B:
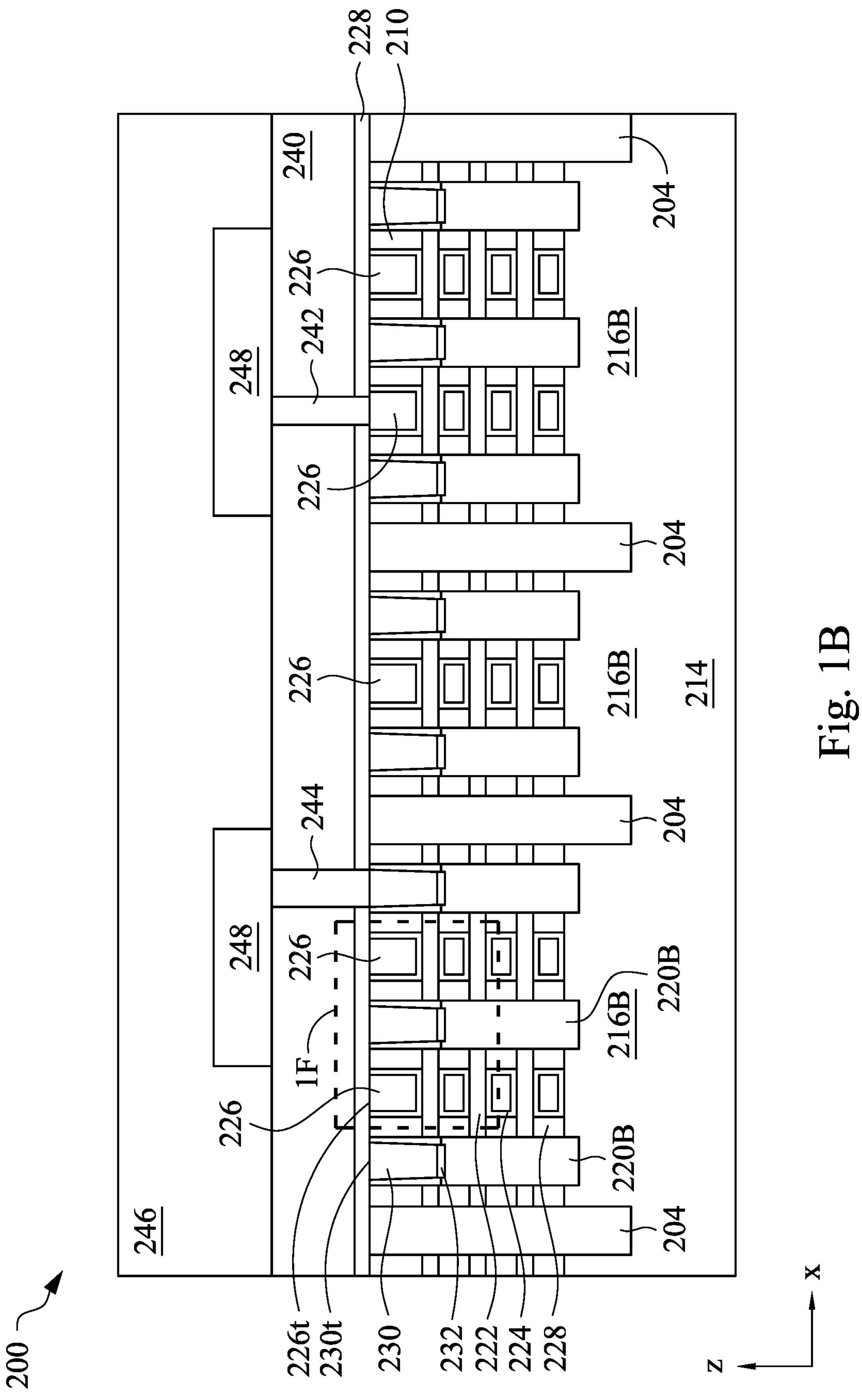
FIGS. 1B-1F are schematic sectional views of the semiconductor device of FIG. 1A.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The foregoing broadly outlines some aspects of embodiments described in this disclosure. While some embodiments described herein are described in the context of nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In addition, although method embodiments may be described in a particular order, various other method embodiments may be performed in any logical order and may include fewer or more steps than what is described herein. Source/drain region(s) may refer to a source or a drain, individually or collectively dependent upon the context.

The present disclosure relates to methods for forming self-aligned source/drain contacts with increased contact size while maintaining the reliability margin between source/drain contacts and gate electrodes. Semiconductor devices according to the present disclosure has contact landing Rc reduction at source/drain contacts as well as device performance improvement. The source/drain contacts formed according to the present disclosure also has lowered height leading to the capacitance reduction of between the source/drain contact to gate electrode. Embodiments of the present disclosure also provides improvements in circuit density and process margin. The self-aligned contact scheme according to the present disclosure allow more aggressive gate pitch (CPP) scaling and also maintain the landing area as well as contact-gate isolation margin. Embodiments of the present disclosure may be used in FinFET devices and GAA devices.

FIG. 1A is a schematic layout view of a semiconductor device 200 according to embodiments of the present disclosure. FIGS. 1B-1F are schematic sectional views of the semiconductor device 200. The semiconductor device 200 is a GAA device. FIG. 1A is a top view of the semiconductor device 200 in an X-Y plane. FIGS. 1B, 1C, 1D, 1E are schematic cross-sectional views of the semiconductor device 200 along the "C2" line, the "C1" line, the "C3" line, and the "C4" line in FIG. 1A respectively. FIG. 1F is a partial enlarged view of the semiconductor device 200 in area 1F marked in FIG. 1B.

In some embodiments, the semiconductor device 200 may be included in a microprocessor, a memory, and/or other IC device. In some embodiments, the semiconductor device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. FIGS. 1B-1E have been simplified for the sake of clarity to better understand the inventive concepts of the present disclosure. Additional features can be added in the semiconductor device 200, and some of the features described below can be replaced, modified, or eliminated in other embodiments of the semiconductor device 200.

The semiconductor device 200 includes multiple standard cells 202, such as NAND cells 202A, INVERTER cells 202B, NOR cells 202C, where each standard cell includes multiple transistors. The standard cells are separated and isolated from each other by dielectric gates 204 and gate-end dielectric features 206. In other words, the dielectric gates 204 and gate-end dielectric features 206 are disposed along the boundary of the STD cells 202. The transistors are formed by (or include) gate stacks 208 (oriented lengthwise along the "y" direction) disposed over active regions 210A and 210B (oriented lengthwise along the "x" direction). The semiconductor device 200 also includes gate sidewall spacers 212 that are disposed along the sidewalls of the gate stacks 208 along the "y" direction.

As shown in FIGS. 1B-1E, the semiconductor device 200 includes a substrate 214, over which the various features including the gate stacks 208 and the active regions 210A and 210*b* are formed. In the depicted embodiment, substrate 214 includes silicon, such as a silicon wafer. Alternatively or additionally, the substrate 214 includes other elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, the substrate 214 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. The substrate 214 can include various doped regions depending on design requirements of the semiconductor device 200.

In the present embodiment, the active regions 210A are n-type doped regions (referred to hereinafter as a n-well), which can be configured for p-type GAA transistors, and the active regions 210B are p-type doped regions (referred to hereinafter as a p-well), which can be configured for n-type GAA transistors. N-type doped regions, such as active regions 210A, are doped with n-type dopants, such as phosphorus, arsenic, other n-type dopant, or combinations thereof. P-type doped regions, such as active regions 210B, are doped with p-type dopants, such as boron, indium, other p-type dopant, or combinations thereof. In some implementations, the substrate 214 includes doped regions formed with a combination of p-type dopants and n-type dopants. The various doped regions can be formed directly on and/or in the substrate 214, for example, providing a p-well structure, an n-well structure, a dual-well structure, a raised structure, or combinations thereof. An ion implantation process, a diffusion process, and/or other suitable doping process can be performed to form the various doped regions.

The semiconductor device 200 further includes fins 216A and 216B disposed over the doped regions 210A and 210B respectively. In some embodiments, fins 216A and 216B are formed by patterning upper portions of the doped regions 210A and 210B, respectively, into the shapes of fins. The fins 216A and 216B may be patterned by any suitable method. For example, the fins 216A and 216B may be patterned using one or more photolithography processes, including double-patterning or multi-patterning processes.

The semiconductor device 200 further includes an isolation feature 218 over the substrate 214 and isolating the fins 216A and 216B from each other. The isolation features 218 may include silicon oxide, silicon nitride, silicon oxynitride, other suitable isolation material (for example, including silicon, oxygen, nitrogen, carbon, or other suitable isolation constituent), or combinations thereof. Isolation features 218 may include different structures, such as shallow trench isolation (STI) structures, deep trench isolation (DTI) structures, and/or local oxidation of silicon (LOCOS) structures. For example, the isolation features 218 can include STI features that define and electrically isolate fins 216A and 216B from other active device regions (such as fins) and/or passive device regions. In some embodiments, STI features include a multi-layer structure that fills the trenches, such as a silicon nitride comprising layer disposed over a thermal oxide comprising liner layer. In another example, STI features include a dielectric layer disposed over a doped liner layer (including, for example, boron silicate glass (BSG) or phosphosilicate glass (PSG)). In yet another example, STI features include a bulk dielectric layer disposed over a liner dielectric layer, where the bulk dielectric layer and the liner dielectric layer include materials depending on design requirements.

The semiconductor device 200 further includes n-type doped source/drain regions 220A disposed over the p-type doped regions 210B and the fins 216B for forming NMOSFET, and p-type doped source/drain regions 220B disposed over the n-type doped regions 210A and fins 216A for forming PMOSFET. The source/drain regions 220A and 220B may be formed using epitaxial growth. For example, a semiconductor material is epitaxially grown from portions of the substrate 214, fins 216A/B, and a stack of semiconductor layers 222, forming the epitaxial source/drain regions 220A and 220B. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of the substrate 214 and/or the semiconductor fins 216A/B. In some embodiments, the epitaxial source/drain regions 220A may include silicon and may be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, the epitaxial source/drain regions 220B may include silicon germanium or germanium and may be doped with boron, other p-type dopant, or combinations thereof (for example, forming Si:Ge:B epitaxial source/drain features). In some embodiments, the epitaxial source/drain regions 220A and/or 220B include more than one epitaxial semiconductor layer, where the epitaxial semiconductor layers can include the same or different materials and/or dopant concentrations. In some embodiments, the epitaxial source/drain regions 220A, 220B include materials and/or dopants that achieve desired tensile stress and/or compressive stress in respective channel regions of the GAA transistors. In some embodiments, the epitaxial source/drain regions 220A, 220B are doped during deposition by adding impurities to a source material of the epitaxy process (i.e., in-situ). In some embodiments, the epitaxial source/drain regions 220A, 220B are doped by an ion implantation process subsequent to a deposition process. In some embodiments, annealing processes (e.g., rapid thermal annealing (RTA) and/or laser annealing) are performed to activate dopants in the epitaxial source/drain regions 220A, 220B and/or other source/drain regions (for example, heavily doped source/drain regions and/or lightly doped source/drain (LDD) regions). In some embodiments, the epitaxial source/drain regions 220A, 220B are formed in separate processing sequences that include, for example, masking p-type GAA transistor regions when forming the epitaxial source/drain regions 220A in n-type GAA transistor regions and masking n-type GAA transistor regions when forming the epitaxial source/drain regions 220B in p-type GAA transistor regions.

The semiconductor device 200 further includes a stack of semiconductor layers 222 suspended between each pair of the source/drain regions 220A and another stack of semiconductor layers 222 suspended between each pair of the source/drain regions 220B. The stack of semiconductor layers 222 serve as the transistor channels for the GAA devices. Accordingly, the semiconductor layers 222 are also referred to as channel layers 222. The channel layers 222 may include single crystalline silicon. Alternatively, the channel layers 222 may comprise germanium, silicon germanium, or another suitable semiconductor material(s). Initially, the channel layers 222 are formed as part of a semiconductor layer stack that includes the channel layers 222 and other semiconductor layers of a different material. As part of the process of forming the fins 216A and 216B, the semiconductor layers 222 also patterned into fins protruding above the substrate 214. During a gate replacement process, the semiconductor layer stack is selectively etched to remove the other semiconductor layers, leaving the channel layers 222 suspended over the substrate 214 and between the respective source/drain regions 220A, 220B. This is also referred to as a channel release process.

Figure 1C:
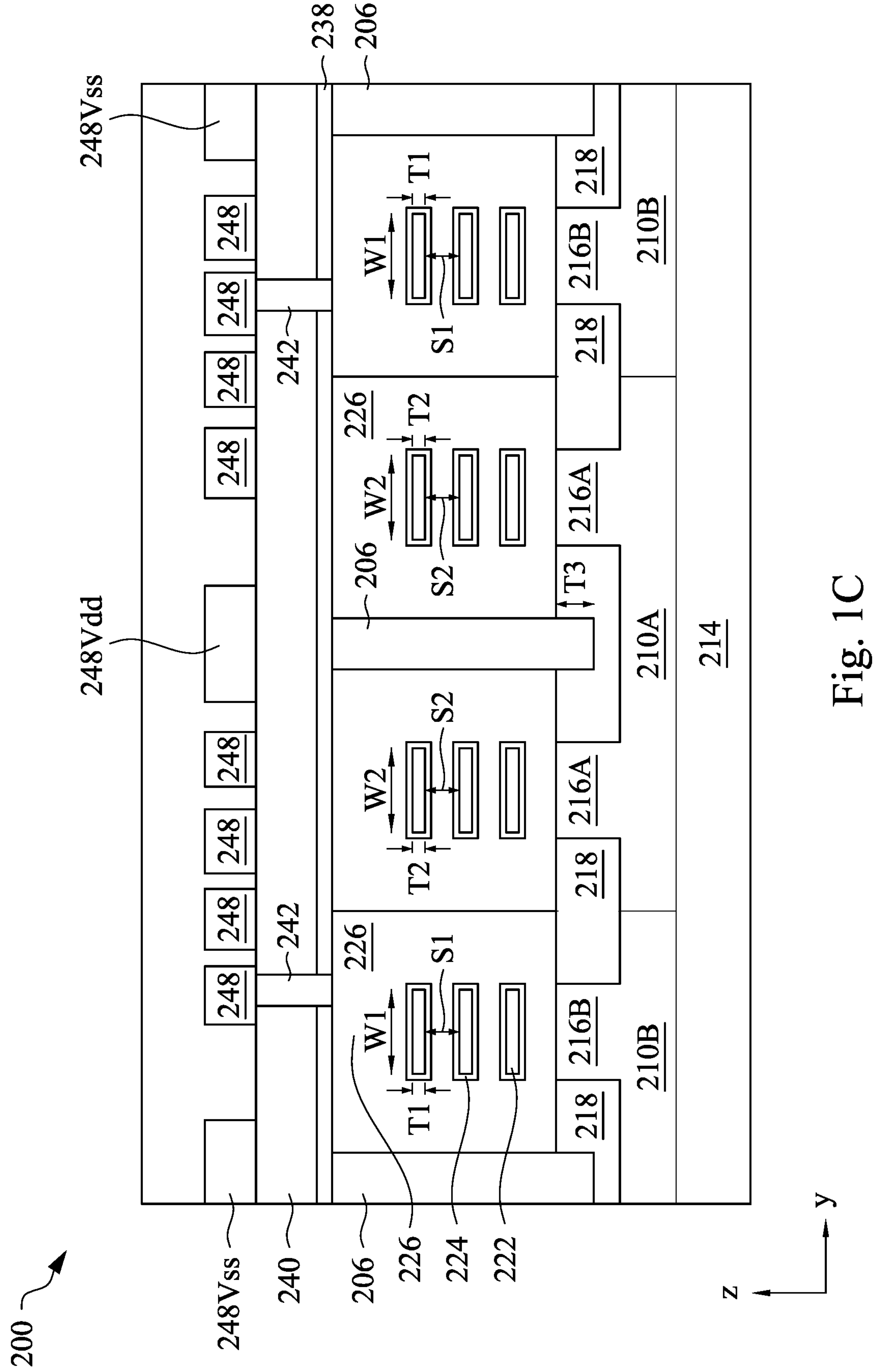
Figure 1D:
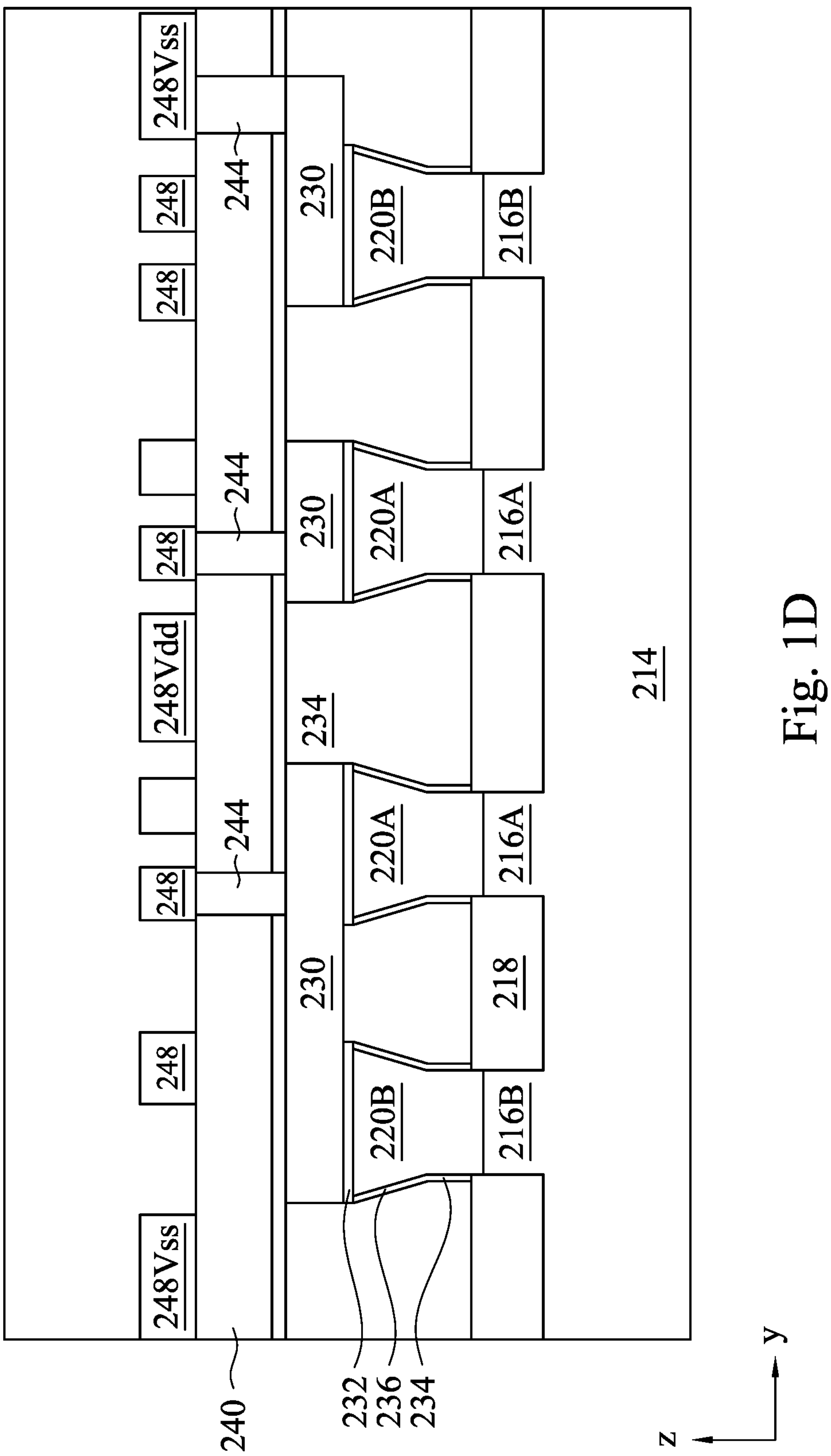
Figure 1E:
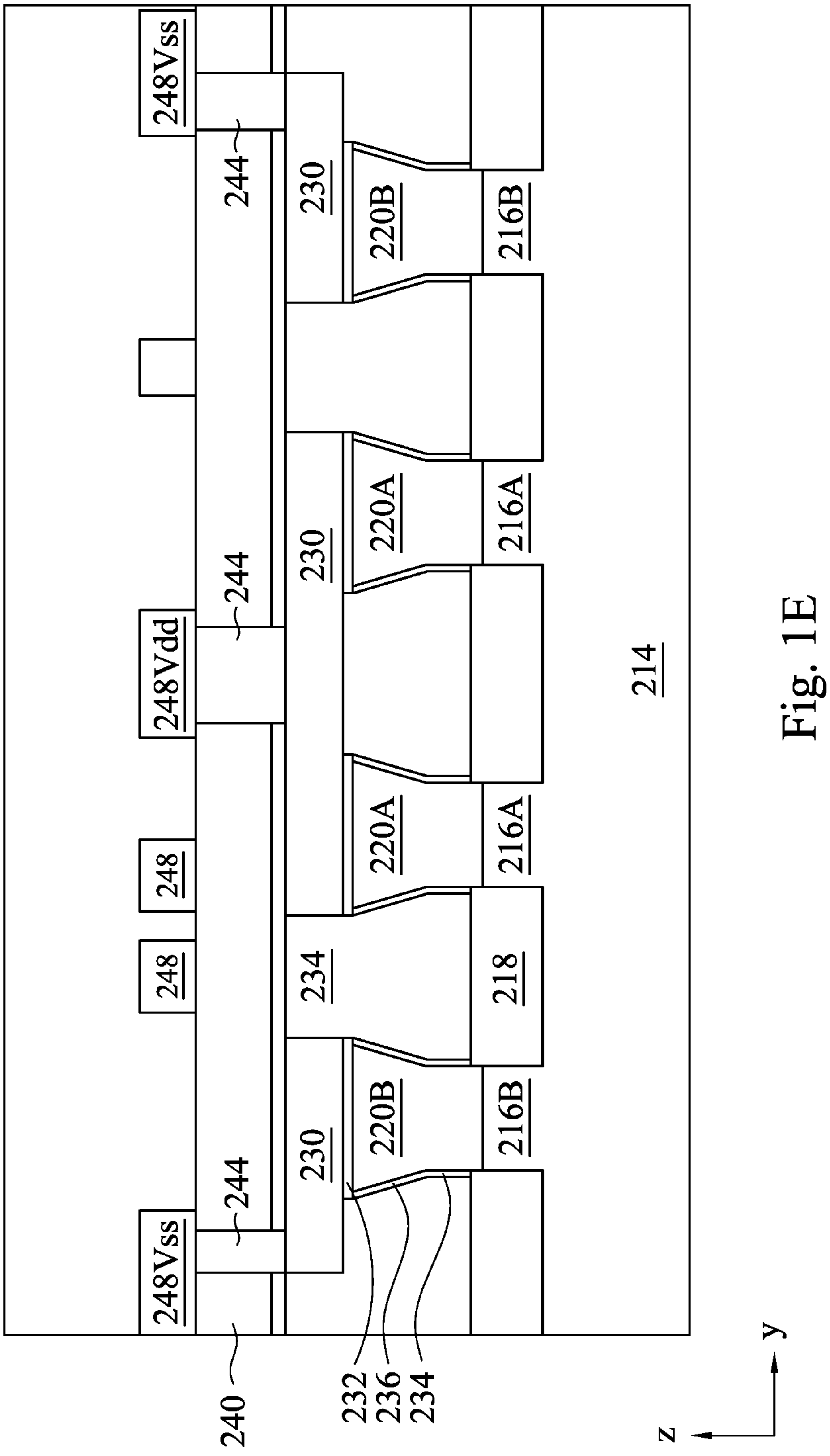
Figure 1F:
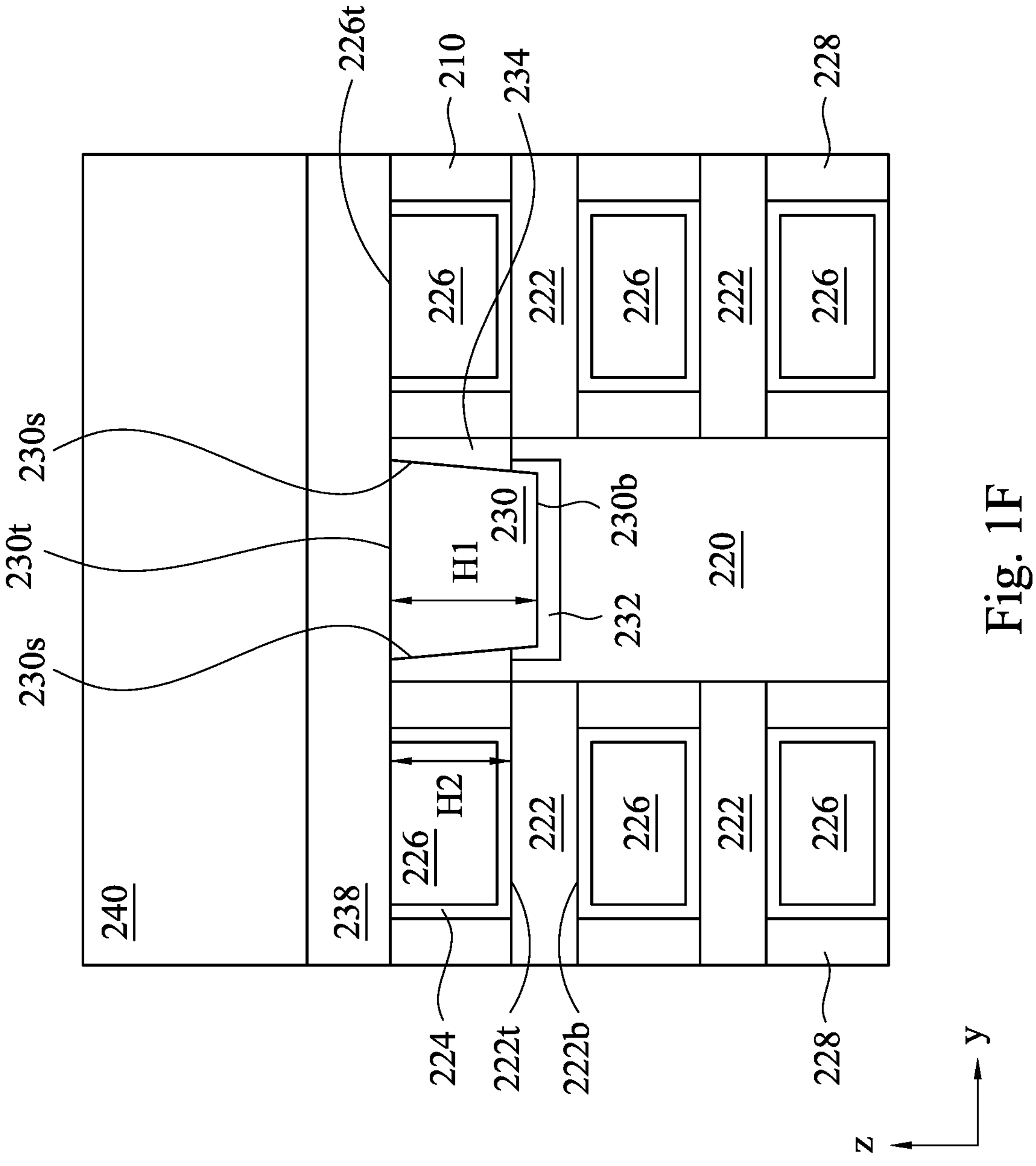

As shown in FIG. 1C, the channel layers 222 for NMOSFET GAA are separated from each other by a spacing S1 along the z-direction, and the channel layers 222 for PMOSFET GAA are separated from each other by a spacing S2 along the z-direction. In some embodiments, the spacing S1 is about equal to S2, though the present disclosure contemplates embodiments where the spacing S1 may be different than spacing S2. Further, the channel layers 222 for NMOSFET GAA have a width W1 along the “y” direction and a thickness “T1” along the “z” direction, and the channel layers 222 for PMOSFET GAA have a width W2 along the “y” direction and a thickness “T2” along the “z” direction. In some embodiments, thickness T1 is about equal to thickness T2, though the present disclosure contemplates embodiments where thickness T1 is different than thickness T2. In some embodiments, width W1 is about equal to width W2. In another embodiment, width W2 is greater than width W1 to boost PMOS device’s performance for balanced CMOS designs. For example, a ratio of width W2 to width W1 may be in a range of 1.05 to 2, although the present disclosure contemplates embodiments where width W1 and width W2 have other configurations including W1 is greater than W2. In some embodiments, width W1 and/or width W2 is about 4 nm to about 10 nm. In some embodiments, each channel layer 222 has nanometer-sized dimensions and can be referred to as a “nanowire,” which generally refers to a channel layer suspended in a manner that will allow a metal gate to physically contact at least two sides of the channel layer, and in GAA transistors, will allow the metal gate to physically contact at least four sides of the channel layer (i.e., surround the channel layer). In such embodiments, a vertical stack of suspended channel layers can be referred to as a nanostructure. In some embodiments, the channel layers 222 may be cylindrical-shaped (e.g., nanowire), rectangular-shaped (e.g., nanobar), sheet-shaped (e.g., nanosheet), etc.), or have other suitable shapes.

The gate stacks 208 includes a gate dielectric layer 224 and a gate electrode layer 226. The gate stack 208 for a PMOSFET GAA is disposed between a pair of p-type source/drain regions 220B, and the gate stack 208 for an NMOSFET GAA is disposed between a pair of n-type source/drain regions 220A. Some gate stacks 208 may connect (or straddle) a PMOSFET GAA and an NMOSFET GAA. The gate dielectric layer 224 wraps around each of the semiconductor layers 222. The gate dielectric layer 224 may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide ($k \approx 3.9$). The gate dielectric layer 224 may be formed by chemical oxidation, thermal oxidation, atomic layer deposition (ALD), chemical vapor deposition (CVD), and/or other suitable methods. In some embodiments, the gate stack 208 further includes an interfacial layer between the gate dielectric layer 224 and the channel layers 222. The interfacial layer may include silicon dioxide, silicon oxynitride, or other suitable materials. In some embodiments, the gate electrode layer 226 includes an n-type work function layer for NMOSFET GAA device or a p-type work function layer for PMOSFET GAA device and further includes a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer 226 may be formed by CVD, PVD, plating, and/or other suitable processes. Since the gate stack 208 includes a high-k dielectric layer and metal layer(s), it is also referred to as a high-k metal gate.

The semiconductor device 200 includes the sidewall spacers 212 on sidewalls of the gate stack 208 and above the top channel layer 222, and further includes inner spacers 228 on sidewalls of the gate stack 208 and below the top channel layer 222. The inner spacers 228 are disposed laterally between the source/drain regions 220A (or 220B) and the gate stacks 208 and vertically between the channel layers 222.

The gate-end dielectric features 206 that are disposed between an end of the gate stack 208 and an end of another gate stack 208, between an end of a gate stack 208 and an end of a dielectric gate 204, and between an end of a dielectric gate 204 and an end of another dielectric gate 204. Some of the gate end dielectric features 206 may be in contact with the source/drain contact 230. The gate end dielectric feature 206 extends into the STI layer 218 for a depth T3. In some embodiments, the depth T3 is in a range between about 5 nm and about 60 nm. The gate-end dielectric features 206 also separate the sidewall spacers 212 along the "y" direction. The sidewall spacers 212, the inner spacers 228, the dielectric gates 204, and gate-end dielectric features 206 collectively provide isolation functions—isolating the gate stacks 208 from each other and from nearby conductors including source/drain regions 220A and 220B and source/drain contacts 230 As device integration continues to increase, such isolation becomes more and more desirable. The materials for the sidewall spacers 212, inner spacers 228, dielectric gates 204, and gate-end dielectric features 206 are selected to provide excellent isolation with small dimensions (thicknesses). Further, the materials for the sidewall spacers 212, inner spacers 228, dielectric gates 204, and gate-end dielectric features 206 are selected to provide low stray (or coupling) capacitance to meet high speed performance.

The materials for the sidewall spacers 212, inner spacers 228, and gate-end dielectric features 206 are different from each other and the gate-end dielectric features 206 have the highest dielectric constant among the three. In an embodiment, the gate-end dielectric features 206 include a high-k material, such as selected from a group consisting of Si3N4, nitrogen-containing oxide, carbon-containing oxide, dielectric metal oxide such as HfO2, HfSiO, HfSiO4, HfSiON, HfLaO, HfTaO, HfTiO, HfZrO, HfAlOx, ZrO, ZrO2, ZrSiO2, AlO, AlSiO, Al2O3, TiO, TiO2, LaO, LaSiO, Ta2O3, Ta2O5, Y2O3, SrTiO3, BaZrO, BaTiO3 (BTO), (Ba,Sr)TiO3 (BST), hafnium dioxide-alumina (HfO2—Al2O3) alloy, other suitable high-k dielectric material, or combinations thereof. In a further embodiment, the inner spacers 228 have a higher effective dielectric constant than the sidewall spacers 212. For example, the inner spacers 228 may include a material selected from a group consisting of SiO2, Si3N4, SiON, SiOC, SiOCN, nitride base dielectric material, air gap, or a combination thereof; and the sidewall spacers 212 may include a material selected from a group consisting of SiO2, Si3N4, carbon doped oxide, nitrogen doped oxide, porous oxide, air gap, or a combination thereof. The dielectric gates 204 may include a dielectric material such as SiO2, SiON, Si3N4, high-k dielectric, or a combination thereof.

The semiconductor device 200 may includes a contact etch stop layer (CESL) 234 formed over the S/D regions 220A/B, the gate stacks 208, the sidewall spacers 212, and the STI layer. The CESL 234 may include La2O3, Al2O3, SiOCN, SiOC, SiCN, SiO2, SiC, ZnO, ZrN, Zr2Al3O9, TiO2, TaO2, ZrO2, HfO2, Si3N4, Y2O3, AlON, TaCN, ZrSi, or other suitable material(s), and may be formed by CVD, PVD, ALD, or other suitable methods. An inter-layer dielectric (ILD) layer 236 is disposed over the CESL 234. The ILD layer 236 may comprise tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof.

The semiconductor device 200 further includes silicide layer 232 over the source/drain regions 220A and 220B, and source/drain contacts 230 over the silicide layer 232. The silicide layer 232 may be formed by depositing one or more metals over the S/D regions 220A/B, performing an annealing process to the semiconductor device 200 to cause reaction between the one or more metals and the S/D regions 220A/B to produce the silicide layer 232, and removing un-reacted portions of the one or more metals. The silicide layer 232 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. In an embodiment, the Source/drain contacts 230 may include a conductive barrier layer and a metal fill layer over the conductive barrier layer. The conductive barrier layer functions to prevent metal materials of the metal fill layer from diffusing into the dielectric layers adjacent the Source/drain contacts 230. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes. In some embodiments, the conductive barrier layer is omitted in the source/drain contacts 230.

In some embodiments, the silicide layer 232 and source/drain contacts 230 are formed by etching S/D contact holes using a self-aligned etching process and then performing the above disclosed deposition, annealing, and other processes in the contact holes to forming the silicide layer 232 and source/drain contacts 230. According to embodiments of the present disclosure, the source/drain contact holes may be formed by a self-aligned process using the gate electrode 206 as an etching mask. After formation of the source/drain contacts 230, a planarization process is performed such that an upper surface 230*t* of the source/drain contacts 230 and an upper surface 226*t* of the gate electrode 226 are co-planar, as shown in FIG. 1F. Top surfaces of the gate dielectric layer 224, the sidewall spacers 212, the CESL 234 are also co-planar with the top surfaces 226*t* of the gate electrode layer 226 and the top surfaces 230*t* of the source/drain contacts 230. Sidewalls 230*s* of the source/drain contacts 230, which face the sidewall spacers 212, are in direct contact with the CESL 234 without the ILD layer 236 in between. The source/drain contacts 230 are isolated from the neighboring gate electrode 226 by the sidewall spacers 212 and the CESL 234. In some embodiments, the upper surface 230*t* of the source/drain contacts 230 and an upper surface 226*t* of the gate electrode 226 are co-planar with a top surface 206*t* of the gate end dielectric features 206.

The source/drain contacts 230 have a height H1 in the z direction. The height H1 may be defined a distance along the z-direction between the silicide layer 232 or a bottom surface 230*b* and the top surface 230*t* of the source/drain contacts 230. The gate electrodes 226 have a height H2 above the topmost channel layer 222 in the z direction. The height H2 may be defined a distance along the z-direction between a top surface 222*t* of the topmost channel 222 and the top surface 226*t* of the gate electrode 230. In some embodiments, the height H1 is in a range between about 3 nm and 80 nm. In some embodiments, the prefer height H1 is in a range between about 3 nm and 40 nm. In some embodiments, the bottom surface 230*b* of the source/drain contact 230 is below the surface 222*t* of the topmost channel 222 layer, and the height H1 is equal to or greater than the height H2. In some embodiments, the bottom surface 230*b* is between the top surface 222*t* of the top most channel 222 and a bottom surface 222*b* of the top most channel 222.

The semiconductor device 200 further includes an etch stop layer 238 above the co-planar top surfaces 230*t*, 226*t*, and an ILD layer 240 disposed above the etch stop layer 238.

In some embodiments, gate vias 242 that are electrically connected to the gate stacks 208. The semiconductor device 200 further includes source/drain contact vias 244 that are electrically connected to the source/drain contacts 230. Each of the gate vias 242 and source/drain contact vias 244 may include a conductive barrier layer and a metal fill layer over the conductive barrier layer. The conductive barrier layer functions to prevent metal materials of the metal fill layer from diffusing into the dielectric layers adjacent the gate vias 242 and the source/drain contact vias 244. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes. The gate vias 242 and the source/drain contact vias 244 are further connected to conductive lines 248 formed in an inter metal dielectric layer (IMD) 246 as part of an interconnect structure.

FIG. 2 is a flow chart of a method 100 for manufacturing of a semiconductor device according to embodiments of the present disclosure. The method 100 may be used to fabricate the semiconductor device 200. FIGS. 3A-3C, 4A-4B, 5A-5B, 6A-6B, 7A-7C, 8A-8C, and 9A-9C schematically illustrate various stages of manufacturing the semiconductor device 200 according to the method 100.

Figure 3A:
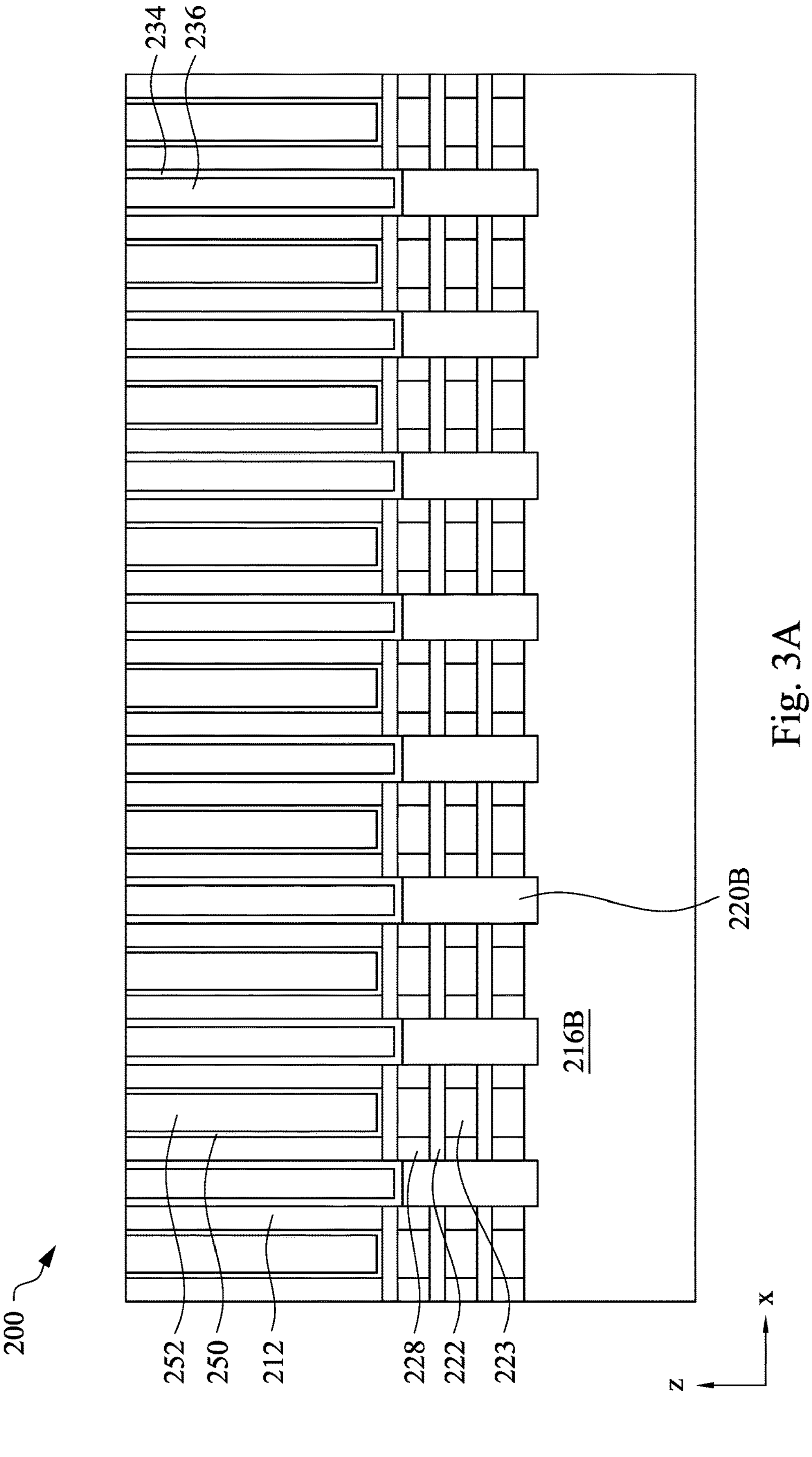
FIGS. 3A-3C, 4A-4B, 5A-5B, 6A-6B, 7A-7C, 8A-8C, and 9A-9C schematically illustrate various stages of manufacturing a semiconductor device according to embodiments of the present disclosure.
Figure 3B:
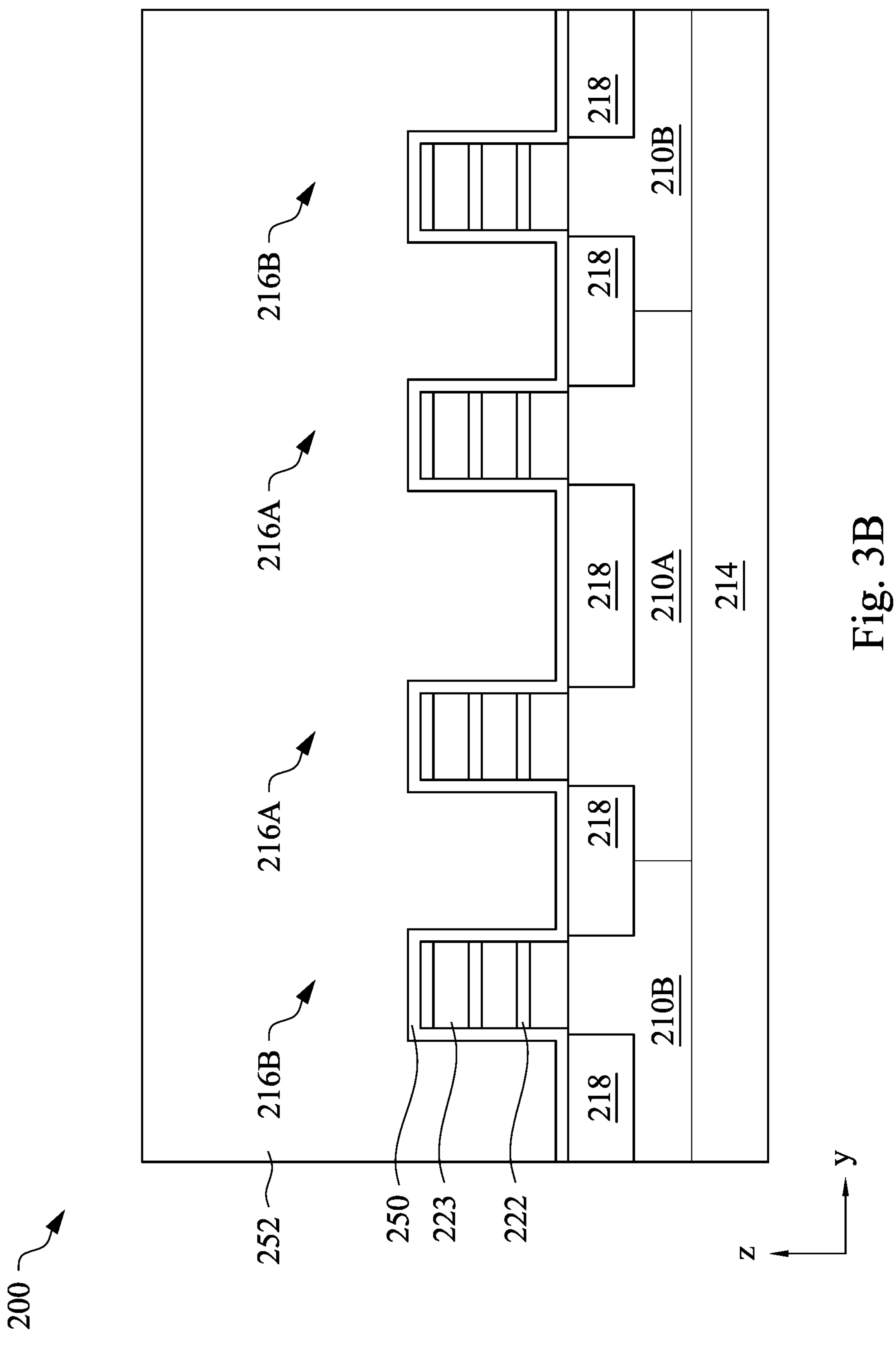
Figure 3C:
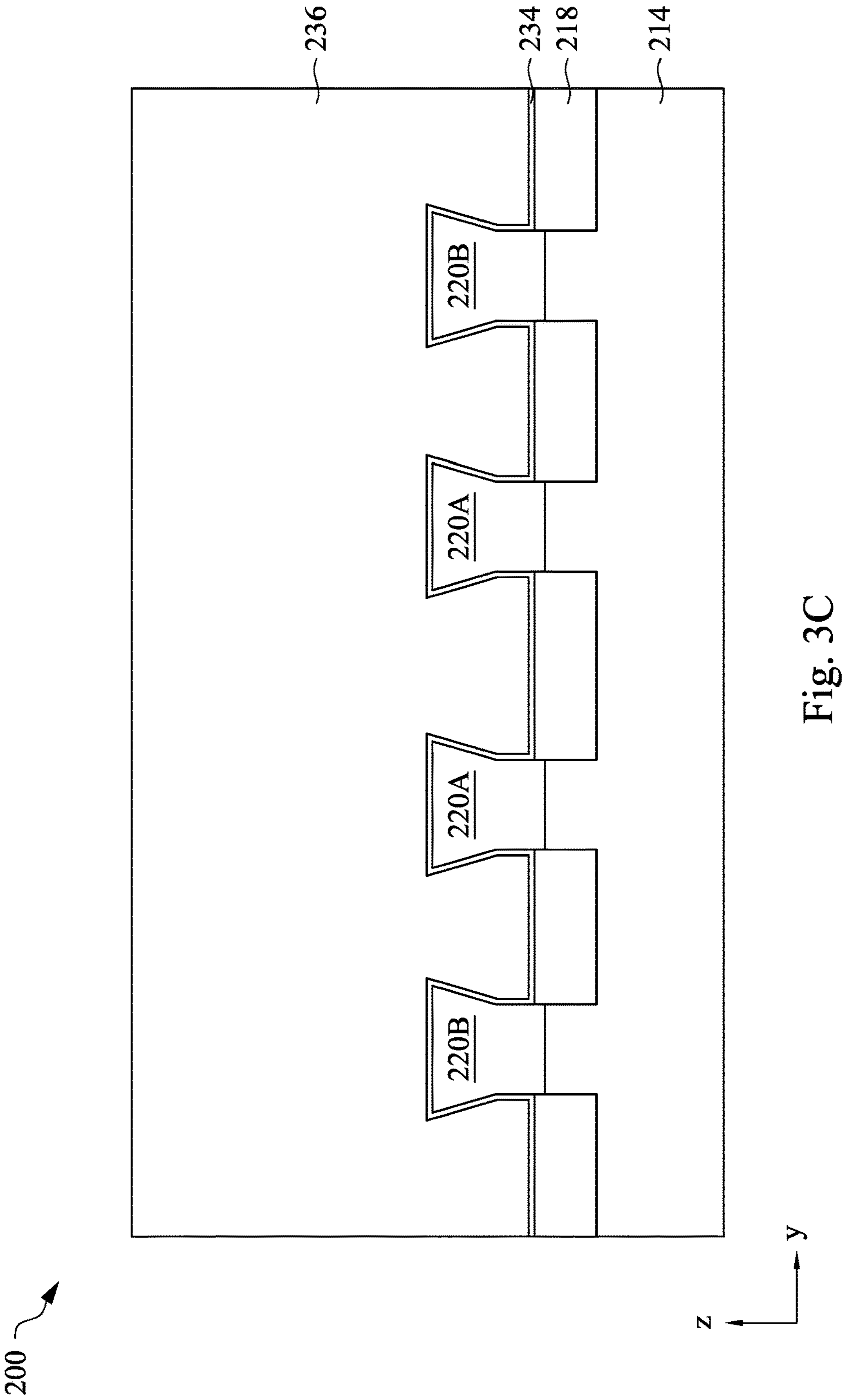

The method 100 begins at operation 102 where semiconductor fins 216A, 216B are formed over a substrate 214, as shown in FIGS. 3A-3C. FIG. 3A is a schematic cross sectional view along the C2 line in FIG. 1A. FIG. 3B is a schematic cross sectional view along the C1 line in FIG. 1A. FIG. 3C is a schematic cross sectional view along the C3 line in FIG. 1A.

The substrate 214 is provided to form the semiconductor device 200 thereon. The substrate 214 may include a single crystalline semiconductor material such as, but not limited to Si, Ge, SiGe, GaAs, InSb, GaP, GaSb, InAlAs, InGaAs, GaSbP, GaAsSb, and InP. The substrate 214 may include various doping configurations depending on circuit design. For example, different doping profiles, e.g., n-wells, p-wells, may be formed in the substrate 214 in regions designed for different device types, such as n-type field effect transistors (nFET), and p-type field effect transistors (pFET). In some embodiments, the substrate 214 may be a silicon-on-insulator (SOI) substrate including an insulator structure (not shown) for enhancement.

The substrate 214 includes a p-doped region or p-well 210B and an n-doped region or n-well 210A. One or more n-type devices, such as nFETs, are to be formed over and/or within p-well 210B. One or more p-type devices, such as pFETs, are to be formed over and/or within n-well 210A.

A semiconductor stack may be formed over the n-well 210A and patterned to form the semiconductor fin 216A. The semiconductor stack includes alternating semiconductor layers made of different materials to facilitate formation of nanosheet channels in a multi-gate n-type device, such as nanosheet channel pFETs. In some embodiments, the semiconductor stack includes first semiconductor layers 222 interposed by second semiconductor layers 223. The first semiconductor layers 222 and second semiconductor layers 223 have different compositions and different oxidation rates and/or different etch selectivity. In later fabrication stages, portions of the second semiconductor layers 222 form nanosheet channels in a multi-gate device. More or less semiconductor layers 222 and 223 may be included in the semiconductor stack depending on the desired number of channels in the semiconductor device to be formed. In some embodiments, the number of semiconductor layers 222 and 223 is between 1 and 10.

In some embodiments, the semiconductor layer 223 may include silicon germanium (SiGe). The semiconductor layer 223 may be a SiGe layer including more than 25% Ge in molar ratio. For example, the semiconductor layer 223 may be a SiGe layer including Ge in a molar ration in a range between 25% and 50%. The semiconductor layer 222 may include silicon, Ge, a compound semiconductor such as SiC, GeAs, GaP, InP, InAs, and/or InSb, an alloy semiconductor such as SiGe, GaAsP, AlInAs, AlGaAs, InGaAs, GaInP, and/or GaInAsP, or combinations thereof. In some embodiments, the semiconductor layer 222 may be a Ge layer. The semiconductor layer 222 may include p-type dopants, boron etc. The semiconductor layer 222 may include silicon (Si). In some embodiments, the semiconductor layer 222 may include n-type dopants, such as phosphorus (P), arsenic (As), etc.

The semiconductor layers 222, 223 may be formed by a molecular beam epitaxy (MBE) process, a metalorganic chemical vapor deposition (MOCVD) process, and/or other suitable epitaxial growth processes. The semiconductor fins 216A, 216B are formed from the semiconductor stacks and a portion of the n-well 210A, the p-well 210B underneath respectively. Each semiconductor fin 216A, 216B has an active portion formed from the semiconductor stacks, and a well portion formed in the n-well 210A, the p-well 210B, respectively.

The shallow trench isolation (STI) layer 218 is then formed by filling in the trenches between the semiconductor fins 216A, 216B and then etching back to below the semiconductor stacks the semiconductor fins 216A, 216B. The isolation material is deposited over the substrate 214 to cover at least a part of the well portions of the semiconductor fins 216A, 216B. The isolation material may be formed by a high-density plasma chemical vapor deposition (HDP-CVD), a flowable CVD (FCVD), or other suitable deposition process. In some embodiments, the isolation material may include silicon oxide, silicon nitride, silicon oxynitride, fluorine-doped silicate glass (FSG), a low-k dielectric, combinations thereof. In some embodiments, the isolation material is formed to cover the semiconductor fins 216A, 216B by a suitable deposition process to fill the trenches between the semiconductor fins 216A, 216B, and then recess etched using a suitable anisotropic etching process to expose the active portions of the semiconductor fins 216A, 216B resulting in the STI layer 218.

In operation 104, sacrificial gate stacks are then formed over the fins 216A, 216B and the sidewall spacers, as shown in FIGS. 3A-3B. A sacrificial gate dielectric layer 250 is deposited over the exposed surfaces of the semiconductor device 200. The sacrificial gate dielectric layer 250 may be formed conformally over the semiconductor fins 216A, 216B, and the isolation layer 218. In some embodiments, the sacrificial gate dielectric layer 250 may be deposited by a CVD process, a sub-atmospheric CVD (SACVD) process, a FCVD process, an ALD process, a PVD process, or other suitable process. The sacrificial gate dielectric layer 250 may include one or more layers of dielectric material, such as $SiO_2$, SiN, a high-k dielectric material, and/or other suitable dielectric material.

A sacrificial gate electrode layer 252 is deposited over the exposed surfaces of the semiconductor device 200. The sacrificial gate electrode layer 252 may be blanket deposited on the over the sacrificial gate dielectric layer 250. The sacrificial gate electrode layer 252 includes silicon such as polycrystalline silicon or amorphous silicon. The thickness of the sacrificial gate electrode layer is in a range between about 42 nm and about 200 nm. In some embodiments, the sacrificial gate electrode layer 252 is subjected to a planarization operation. The sacrificial gate electrode layer 252 may be deposited using CVD, including LPCVD and PECVD, PVD, ALD, or other suitable process.

The sacrificial gate structures are formed over the isolation layer 218 and over the exposed portions of the semiconductor fins 216A, 216B. The sacrificial gate structures are formed over portions of the semiconductor fins 216A, 216B which are to be channel regions. A patterning operation is performed the sacrificial gate electrode layer 252 and the sacrificial gate dielectric layer 250 to form the sacrificial gate structures.

The sidewall spacers 212 and inner spacers 228 are formed. The sidewall spacers 212 are formed on sidewalls of the sacrificial gate structures. After the sacrificial gate structures are formed, the sidewall spacers 212 are formed by a blanket deposition of an insulating material followed by anisotropic etch to remove insulating material from horizontal surfaces. The sidewall spacers 212 may have a thickness in a range between about 4 nm and about 7 nm. In some embodiments, the insulating material of the sidewall spacers 212 is a silicon nitride-based material, such as SiN, SiON, SiOCN or SiCN and combinations thereof. The exposed semiconductor fins 216A, 216B are etched and the inner spacers 228 are formed. Even though described together in each operation, processes for regions for p-type devices, i.e. over the n-well 210A, and for n-type devices, i.e. over the p-well 210B, may be performed separately using patterned masks and different processing recipes.

The semiconductor fins 216A, 216B not covered by the sacrificial gate structures are etched to expose well portions of the semiconductor fins 216A, 216B. In some embodiments, suitable dry etching and/or wet etching may be used to remove the semiconductor layers 222, 223, together or separately.

After recess etch of the semiconductor fins 216A, 216B, the inner spacers 228 are formed. To form the inner spacers 228, the semiconductor layers 223 under the sidewall spacers 212 are selectively etched from the semiconductor layers 222 along the horizontal direction, or x-direction, to form spacer cavities. In some embodiments, the semiconductor layers 223 can be selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. In some embodiments, an etching thickness of the semiconductor layers 223 is in a range between about 2 nm and about 10 nm along the X direction.

After forming the spacer cavities, the inner spacers 228 are formed in the spacer cavities by conformally deposit and then partially remove an insulating layer. The insulating layer can be formed by ALD or any other suitable method. The subsequent etch process removes most of the insulating layer except inside the cavities, resulting in the inner spacers 228. The inner spacers 228 have a thickness along the X direction in a range from about 4 nm to about 7 nm.

In operation 106, epitaxial source/drain regions 216A, 216B are formed, as shown in FIGS. 1A and 1C. As discussed above, the epitaxial source/drain regions 216A for the p-type devices and the epitaxial source/drain regions 216B for the n-type devices are formed using patterned masks and different epitaxial processes.

The epitaxial source/drain regions 216A for the p-type devices may include one or more layers of Si, SiGe, Ge with p-type dopants, such as boron (B), for a p-type device, such as pFET. In some embodiments, the epitaxial source/drain regions 216A may be SiGeB material, wherein boron is a dopant. The epitaxial source/drain regions 216B for n-type devices may include one or more layers of Si, SiP, SiC and SiCP. The epitaxial source/drain regions 216B also include n-type dopants, such as phosphorus (P), arsenic (As), etc. In some embodiments, the epitaxial source/drain regions 216B may be a Si layer includes phosphorus dopants.

In operation 108, the contact etch stop layer (CESL) 234 and the interlayer dielectric (ILD) layer 236 are formed over the exposed surfaces as shown in FIGS. 3A-3C. The CESL 234 is formed on the epitaxial source/drain regions 216A, 216B the sidewall spacers 212, and the isolation layer 218. In some embodiments, the CESL 234 has a thickness in a range between about 4 nm and about 7 nm. The CESL 234 may include $Si_3N_4$, SiON, SiCN or any other suitable material, and may be formed by CVD, PVD, or ALD.

The interlayer dielectric (ILD) layer 236 is formed over the CESL 234. The materials for the ILD layer 236 include compounds comprising Si, O, C, and/or H, such as silicon oxide, SiCOH and SiOC. Organic materials, such as polymers, may be used for the ILD layer 236. The ILD layer 236 protects the epitaxial source/drain regions 216A, 216B during the removal of the sacrificial gate structures. A planarization process may be performed after depositing the ILD layer 236 to expose the sacrificial gate electrode layer 252.

Figure 4A:
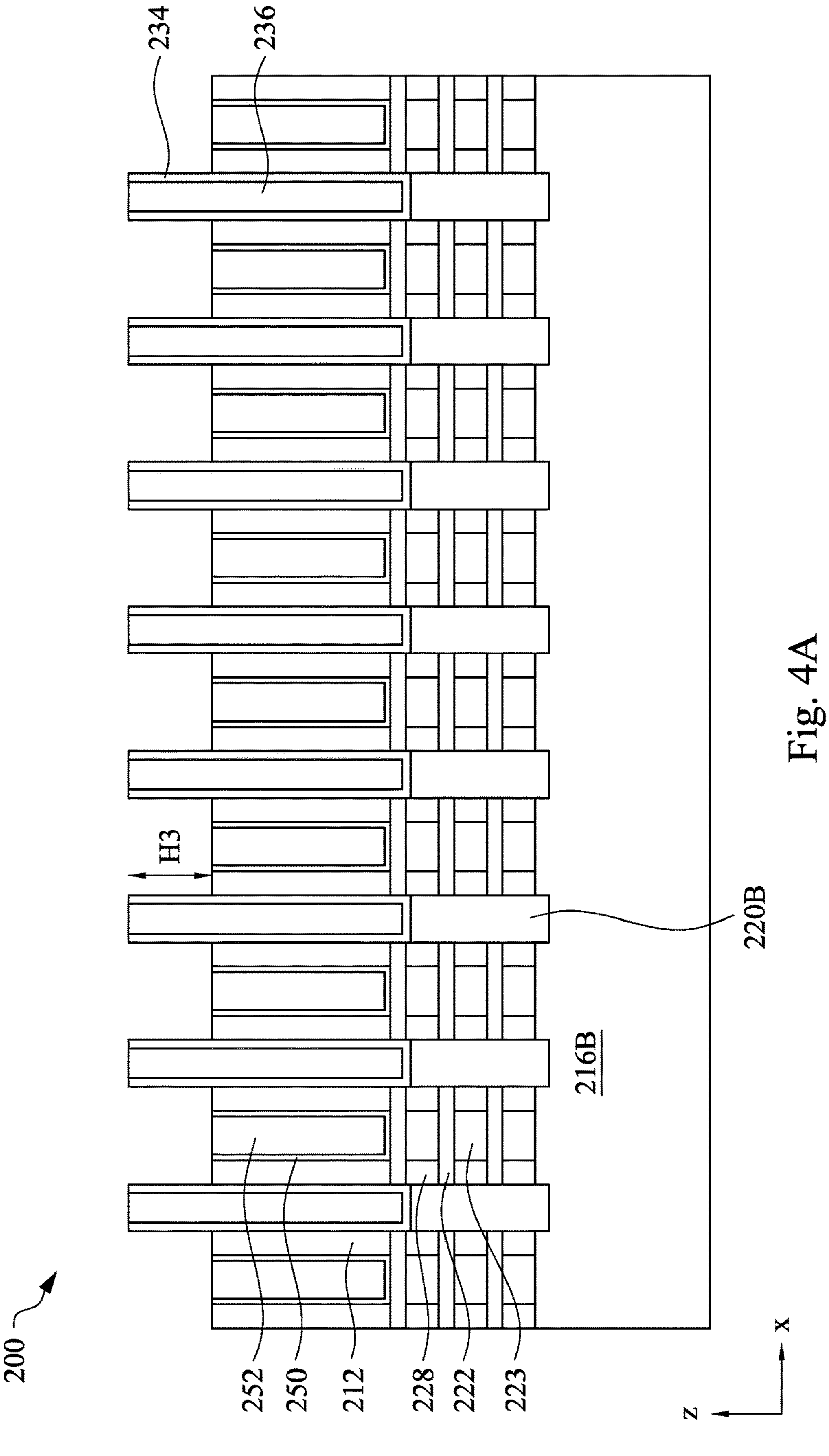
Figure 4B:
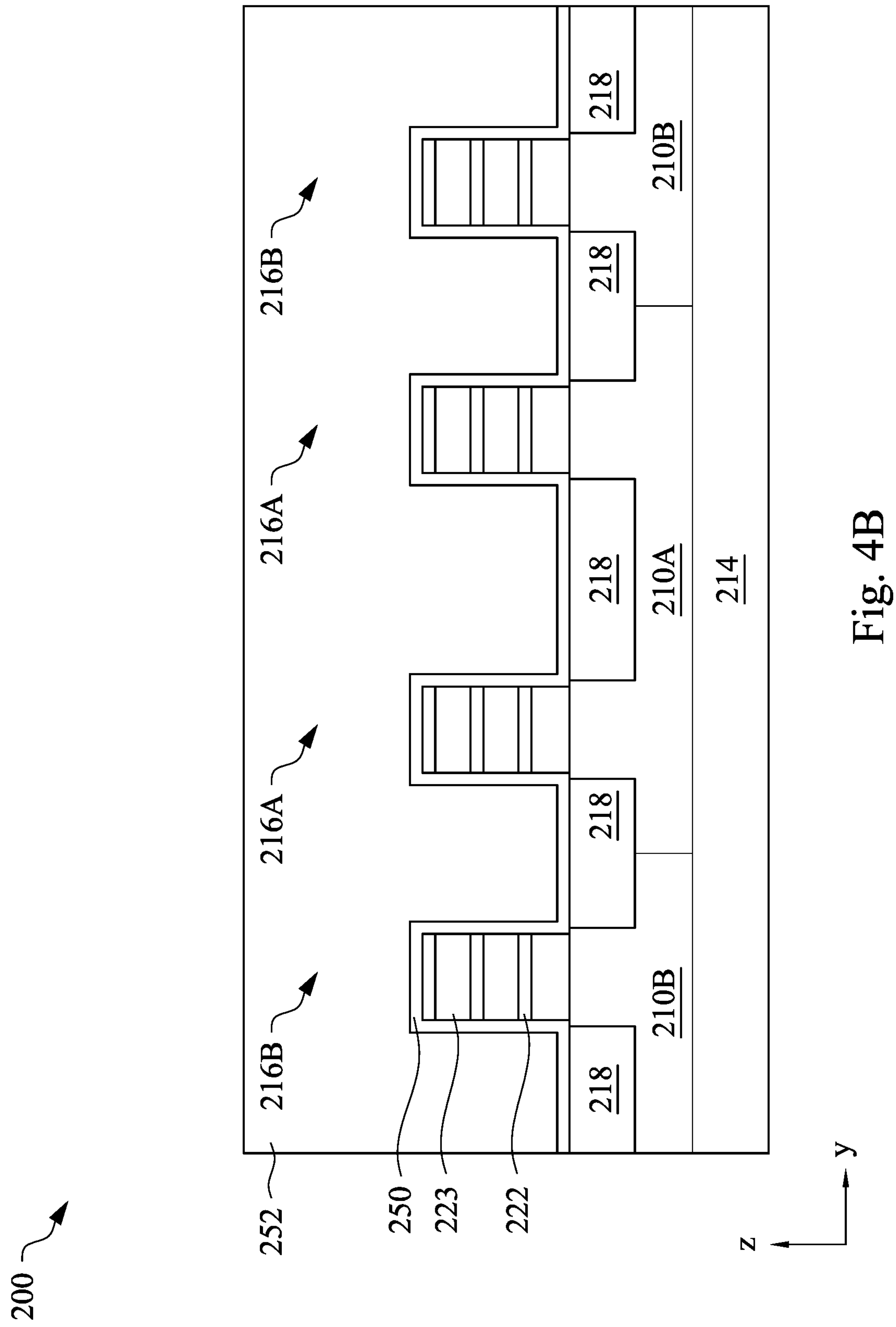

In operation 110, a portion of sidewall spacers 212 is etched back, as shown in FIGS. 4A-4B. FIG. 4A is a schematic cross sectional view along the C2 line in FIG. 1A. FIG. 4B is a schematic cross sectional view along the C1 line in FIG. 1A. A suitable etch process is performed to selectively etch the sidewall spacers 212 to a level below the CESL 234 and the ILD layer 236. In some embodiments, the sacrificial gate electrode layer 252 and the sacrificial gate dielectric layer 250 may be etched with the sidewall spacers 212. Alternatively, the sacrificial gate electrode layer 252 and the sacrificial gate dielectric layer 250 may be etched back with a different etch process. In some embodiments, the sidewall spacers 212 is etched back for a height H3 along the z-direction. In some embodiments, the height H3 is in a range between about 10 nm about 60 nm. The height H3 is selected in a range to form a mask thick enough to protect the sidewall spacers 212 during formation of source/drain contacts 230.

Figure 5A:
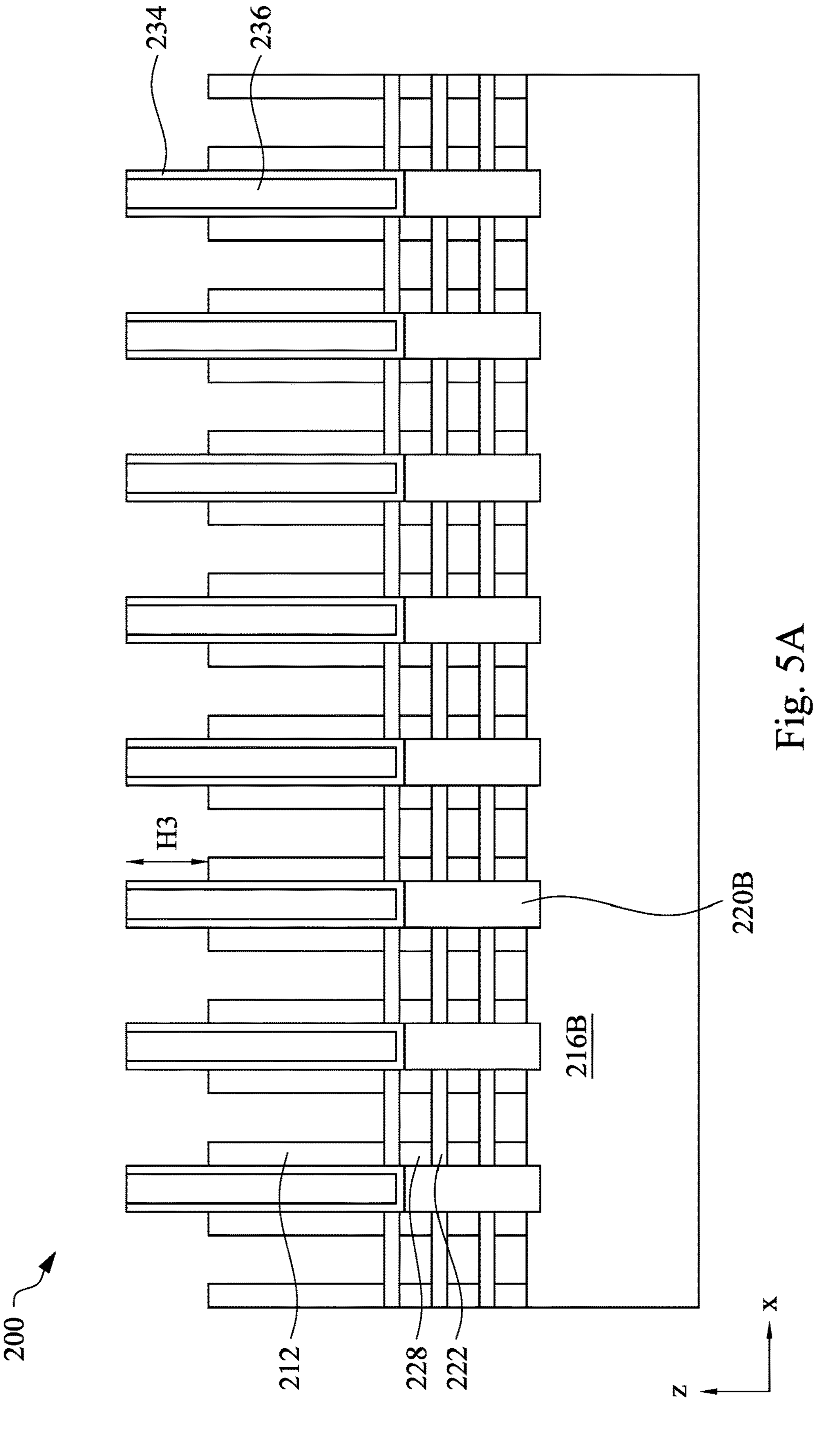
Figure 5B:
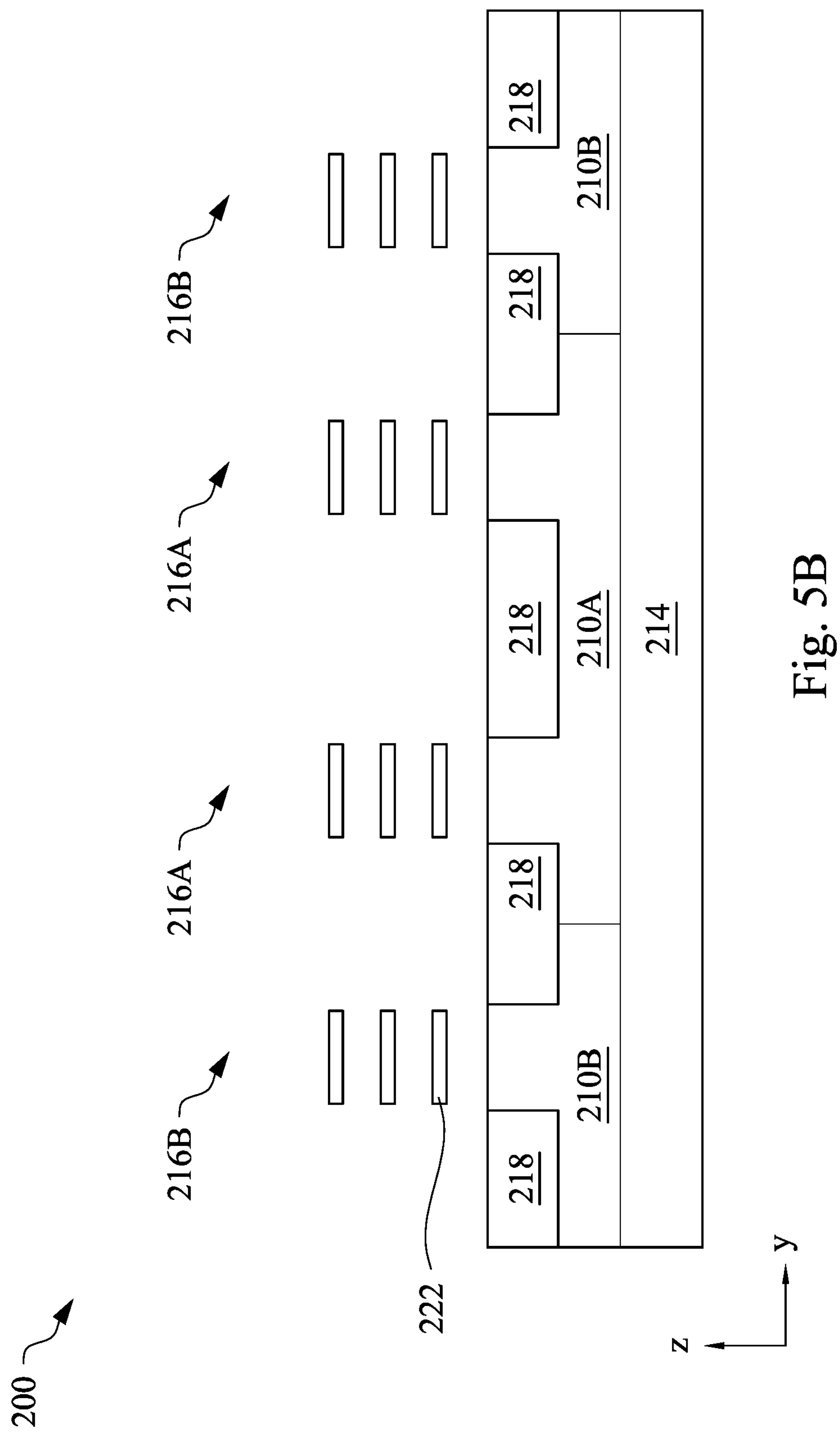

In operation 112, the sacrificial gate electrode layer 252, the sacrificial gate dielectric layer 250, as shown in FIGS. 5A-5B. FIG. 5A is a schematic cross sectional view along the C2 line in FIG. 1A. FIG. 5B is a schematic cross sectional view along the C1 line in FIG. 1A. The sacrificial gate electrode layer 252 and the sacrificial gate dielectric layer 250 may be sequentially removed. The sacrificial gate electrode layer 252 can be removed using plasma dry etching and/or wet etching. When the sacrificial gate electrode layer 252 is polysilicon, a wet etchant such as a Tetramethylammonium hydroxide (TMAH) solution can be used to selectively remove the sacrificial gate electrode layer 252 without removing the dielectric materials of the ILD layer 236, the CESL 234. The sacrificial gate dielectric layer 250 may be removed using a suitable etch process after removal of the sacrificial gate electrode layer 252.

The semiconductor layers 223 are then removed during the same etch process or different processes. The semiconductor layers 223 can be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solution.

Figure 6A:
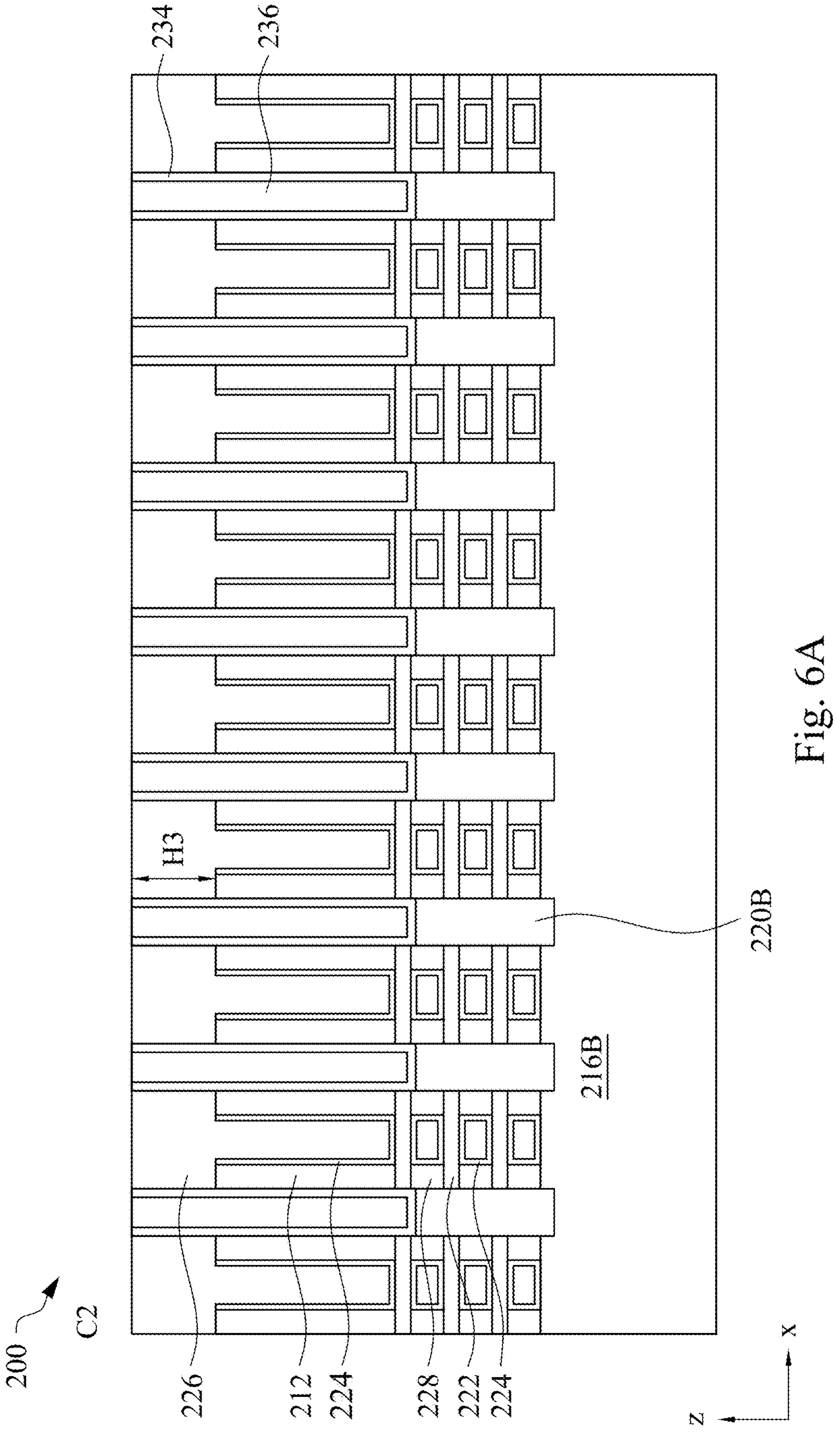
Figure 6B:
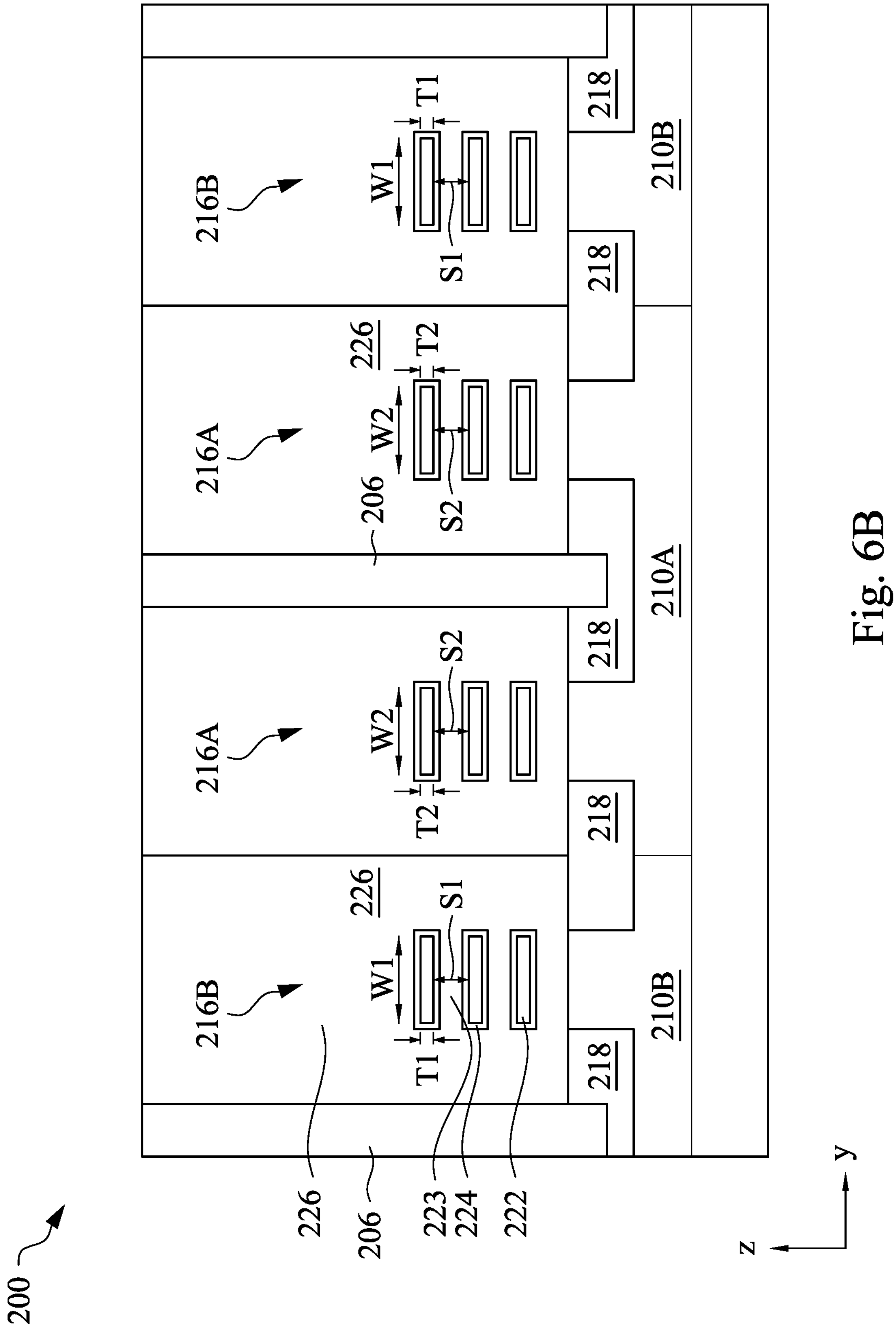

In operation 114, replacement gate structures 208 are formed, as shown in 6A-6B. FIG. 6A is a schematic cross sectional view along the C2 line in FIG. 1A. FIG. 6B is a schematic cross sectional view along the C1 line in FIG. 1A. The replacement gate structure 208 may include a gate dielectric layer 224, and a gate electrode layer 226.

The gate dielectric layer 224 is formed on exposed surfaces after removal of the sacrificial gate structures. In some embodiments, the gate dielectric layer 224 may have different composition and dimensions for the n-type devices and p-type devices and are formed separately using patterned mask layers and different deposition recipes. The gate dielectric layer 224 may include one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate dielectric layer 224 may be formed by CVD, ALD or any suitable method. In some embodiments, the thickness of the gate dielectric layer 224 is in a range between about 1 nm and about 6 nm. In some embodiments, an interfacial layer may be formed between the semiconductor layers 222 and the gate dielectric layer 224.

The gate electrode layer 226 is formed on the gate dielectric layer 224 to fill the gate cavities. The gate electrode layer 226 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In some embodiments, the gate electrode layer 226 may be formed by CVD, ALD, electroplating, or other suitable method. In some embodiments, a planarization process may be performed after formation of the gate electrode layer 226.

In some embodiments, a planarization process is performed after deposition of the gate electrode layer 226. As shown in FIG. 6A, the gate electrode layer 226 has a T shaped profile in the cross section of along the x-z plane. The T-shape of the gate electrode layer 226 covers the sidewall spacers 212 during the subsequent processes.

In some embodiments, the gate-end dielectric features 206 may be formed. An etch mask covering most part of the semiconductor device 200 but exposes those areas vertically (along "x" direction) along the STD cell boundary may be formed by photolithography process. The sidewall spacers 212 and the gate structures 208 exposed are etched through these openings using one or more etching process. The etching process can include a dry etching process, a wet etching process, other suitable etching process, or combinations thereof. The etching process completely removes the gate electrode 226 exposed in the openings of the etch mask, thereby cutting the gate electrode 226 into segments. The etching process may completely or partially remove the sidewall spacers 212 exposed in the openings of the etch mask. One or more dielectric layers into the trenches and performs a CMP process to the one or more dielectric layers to form the gate-end dielectric features 206.

Figure 7A:
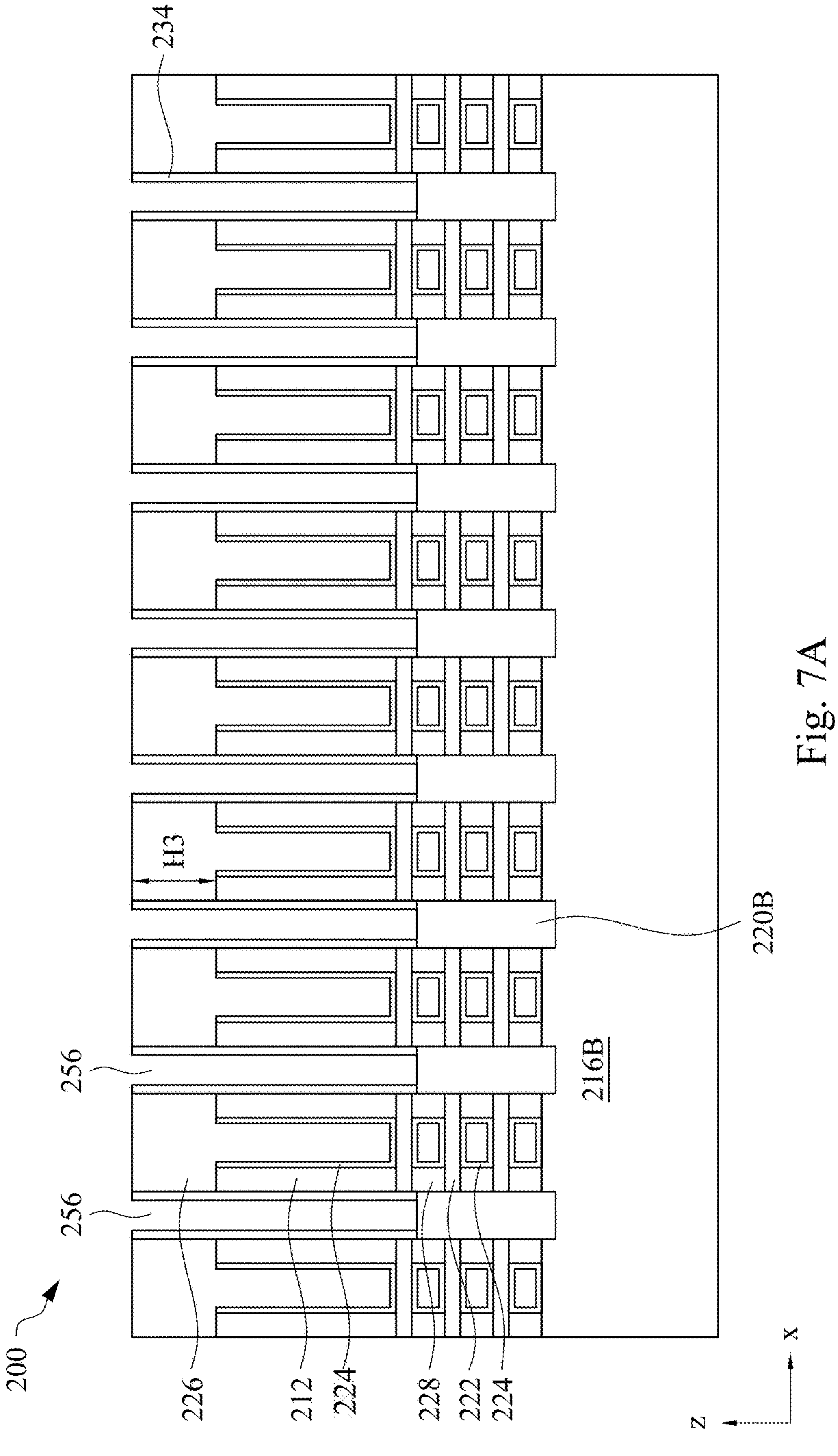
Figure 7B:
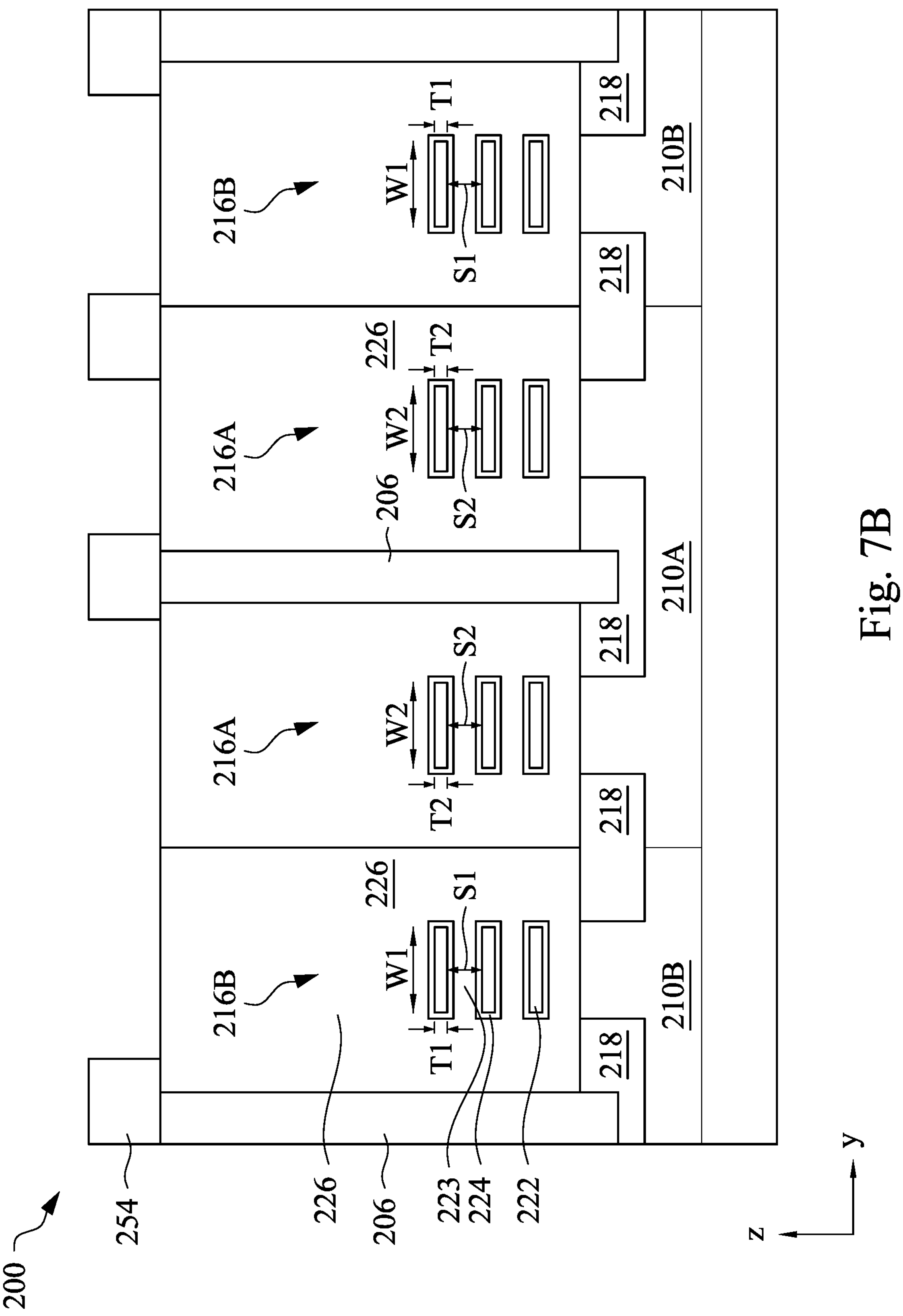
Figure 7C:
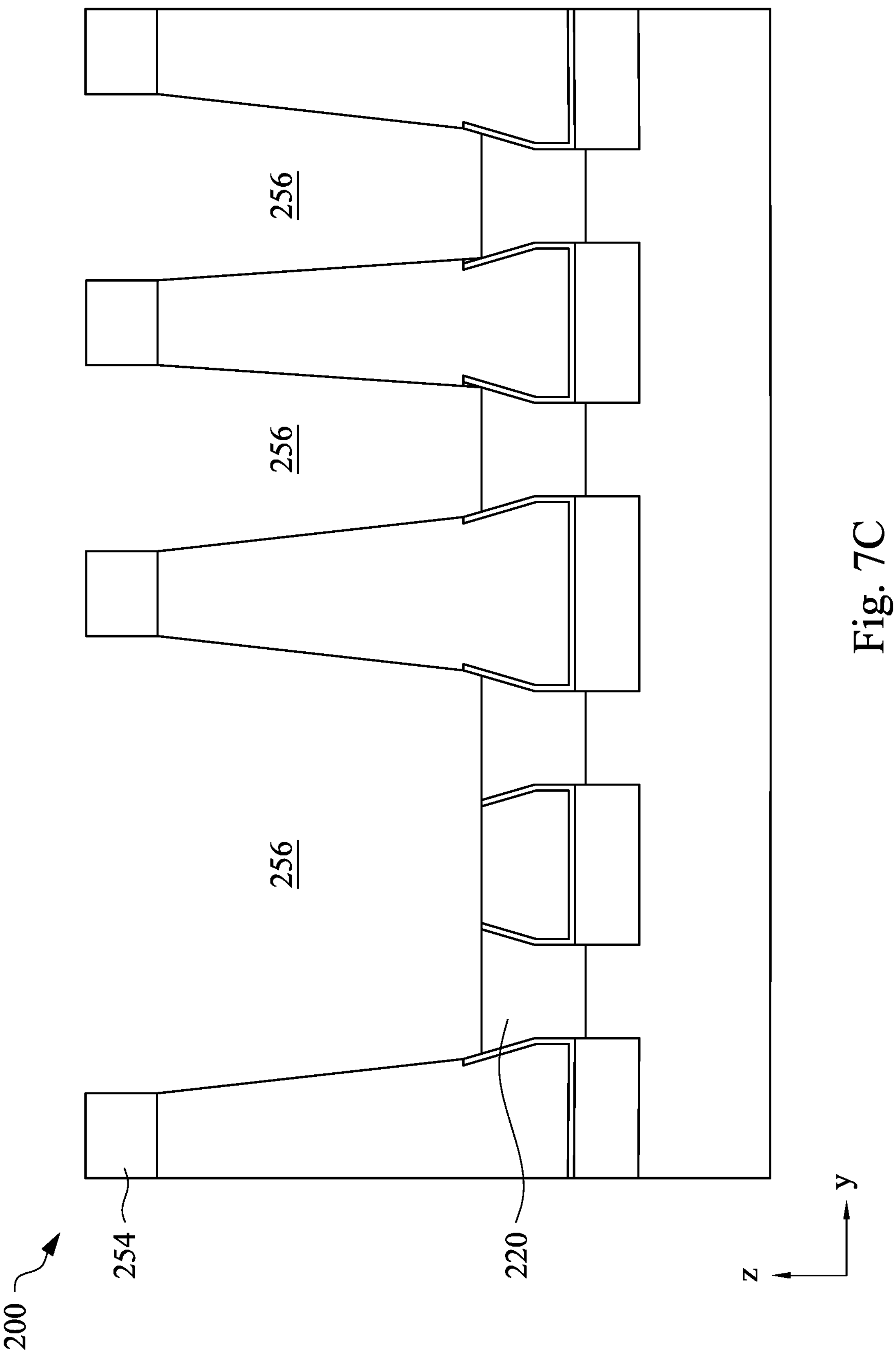

In operation 116, contact holes 256 for formed using a self-aligned process as shown in FIGS. 7A-7C. FIG. 7A is a schematic cross sectional view along the C2 line in FIG. 1A. FIG. 7B is a schematic cross sectional view along the C1 line in FIG. 1A. FIG. 7B is a schematic cross sectional view along the C3 line in FIG. 1A.

In some embodiments, a mask 254 may be formed over the semiconductor device 200. The mask 254 may include openings to expose the ILD layer 236 over the source/drain regions 220 and the adjacent gate electrode layers 226. The openings in the mask 254 are wider than the distance source/drain regions 220 in the x direction to maximize dimension of the contact holes 256 in along x direction. The contact holes 256 are formed by selectively etching the ILD layer 236 exposed by the mask 254. During the etching process, the top portion of the gate electrode layer 226 serves as a mask to protect the sidewall spacers 212 underneath. In some embodiments, the contact holes 256 exposes the source/drain regions 220.

Figure 8A:
Figure 8B:
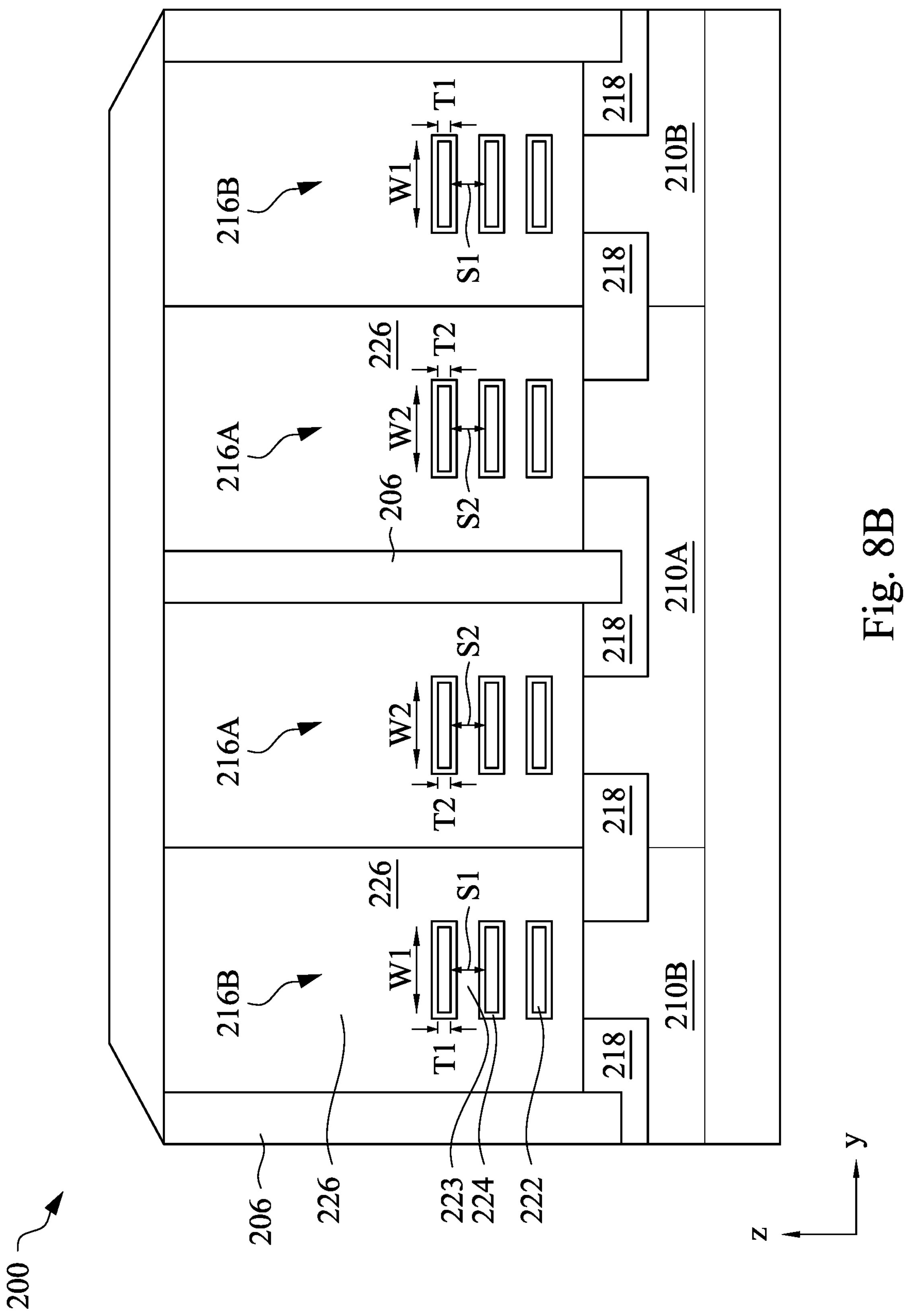
Figure 8C:
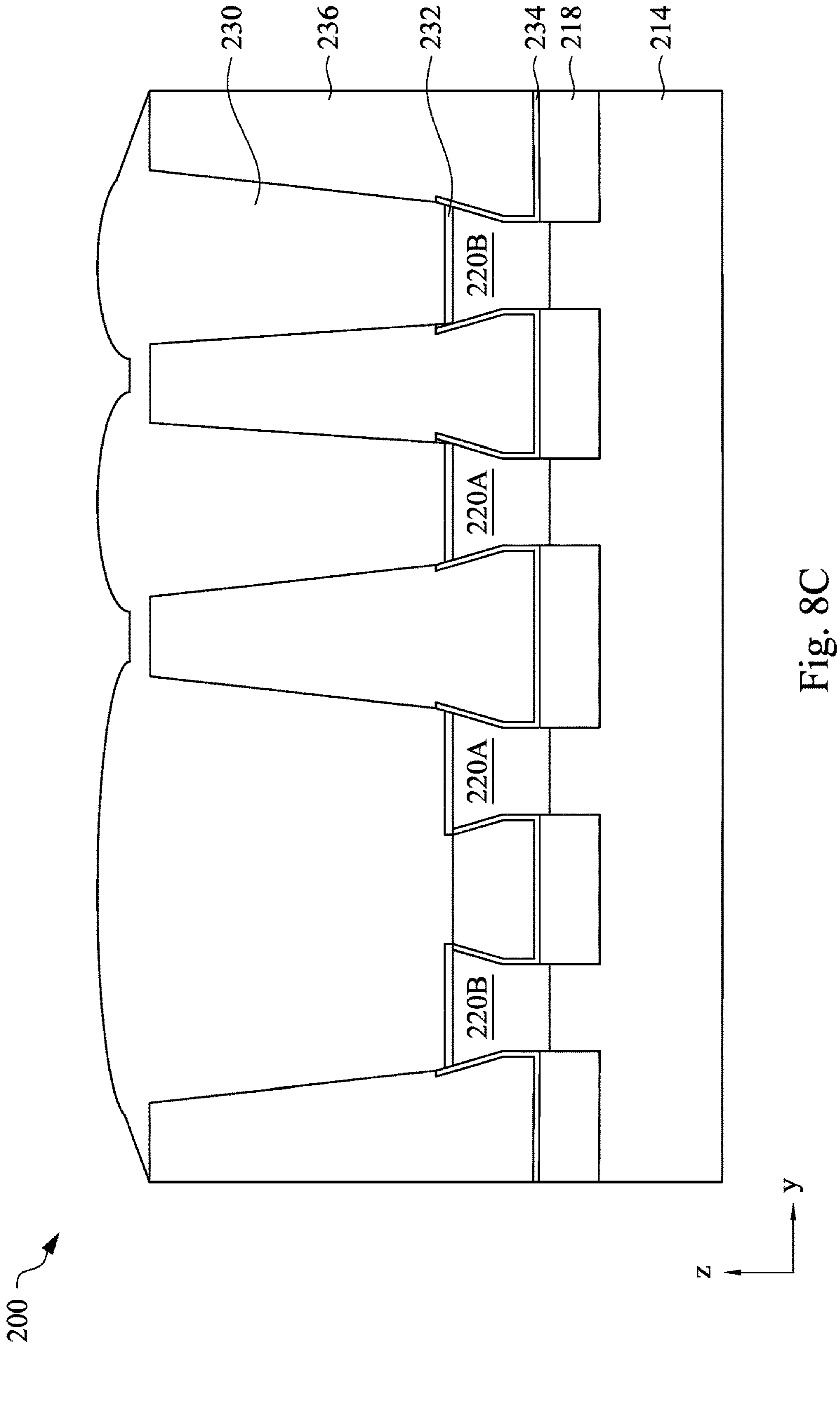

In operation 118, source/drain contact features 230 are formed in the contact holes 254, as shown in FIGS. 8A-8C. FIG. 8A is a schematic cross sectional view along the C2 line in FIG. 1A. FIG. 8B is a schematic cross sectional view along the C1 line in FIG. 1A. FIG. 8B is a schematic cross sectional view along the C3 line in FIG. 1A. After the formation of the contact holes 254, the silicide layer 232 is selectively formed over an exposed top surface of the epitaxial source/drain regions 216A, 216B exposed by the contact holes 254. The source/drain contacts 230 are then formed by filling the contact holes with a conductive material. In some embodiments, the conductive material for the source/drain contacts 230 may be formed by CVD, PVD, plating, ALD, or other suitable technique. In some embodiments, the conductive material may include TiN, TaN, Ta, Ti, Hf, Zr, Ni, W, Co, Cu, Ag, Al, Zn, Ca, Au, Mg, Mo, Cr, or the like.

Figure 9A:
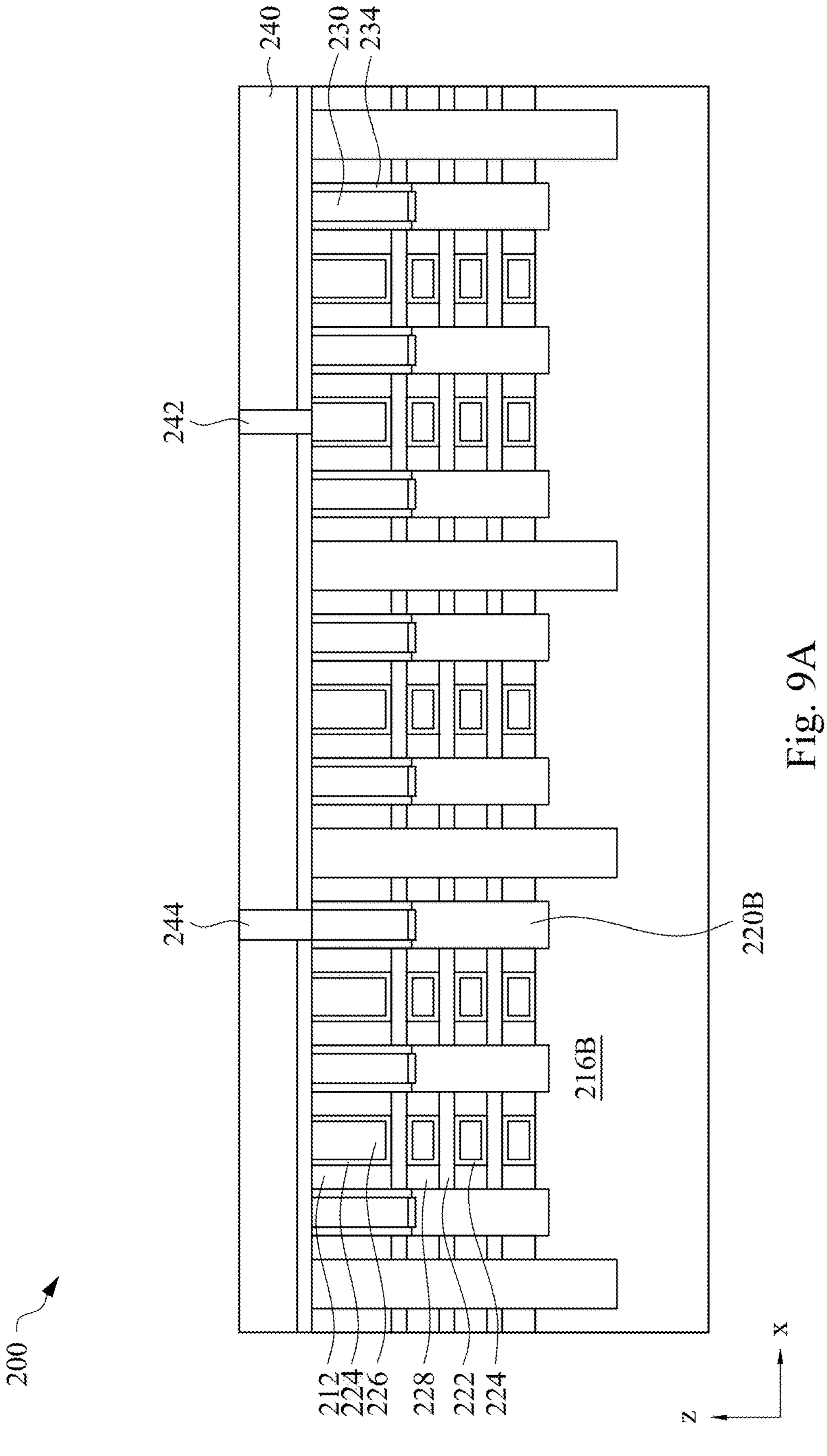
Figure 9B:
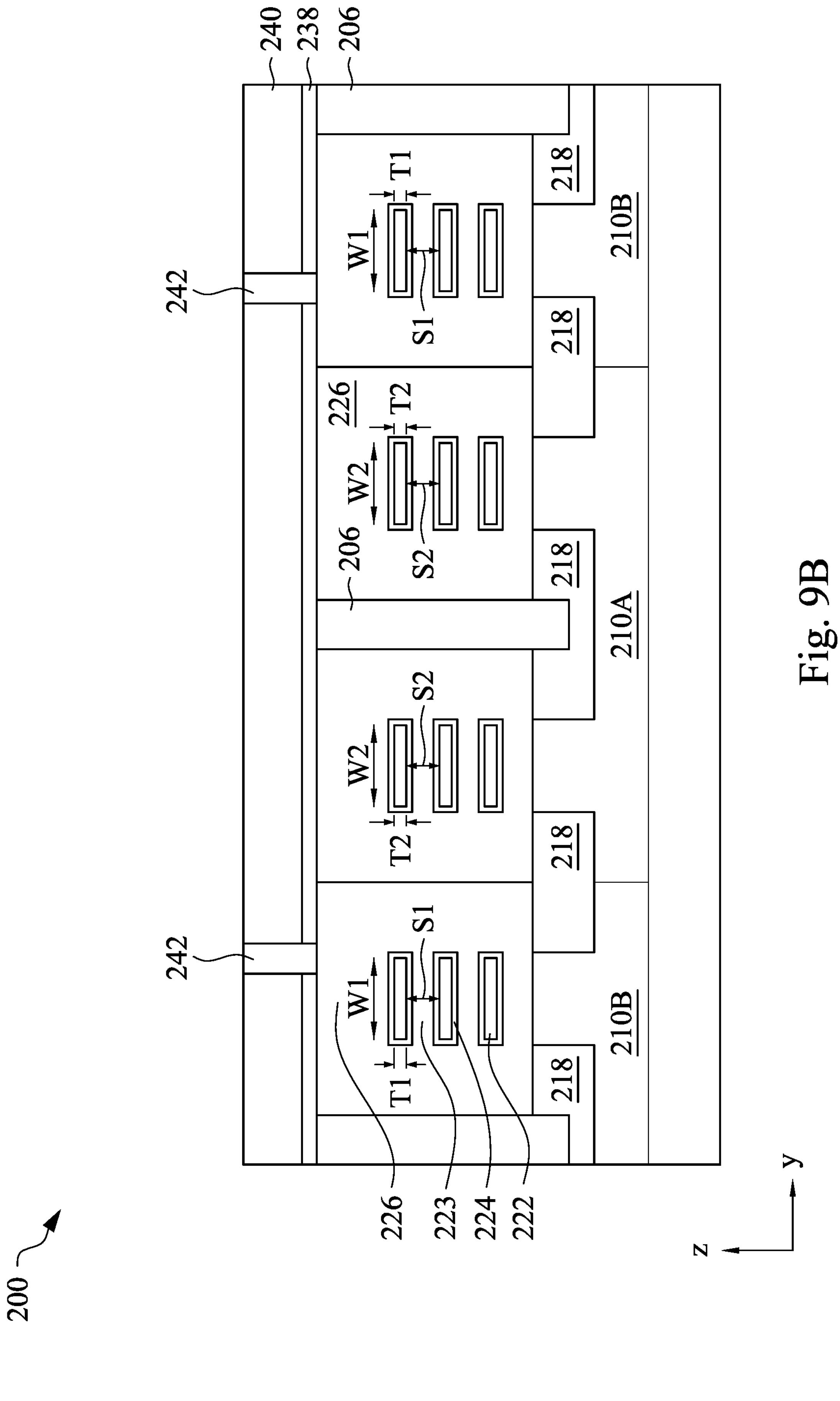
Figure 9C:
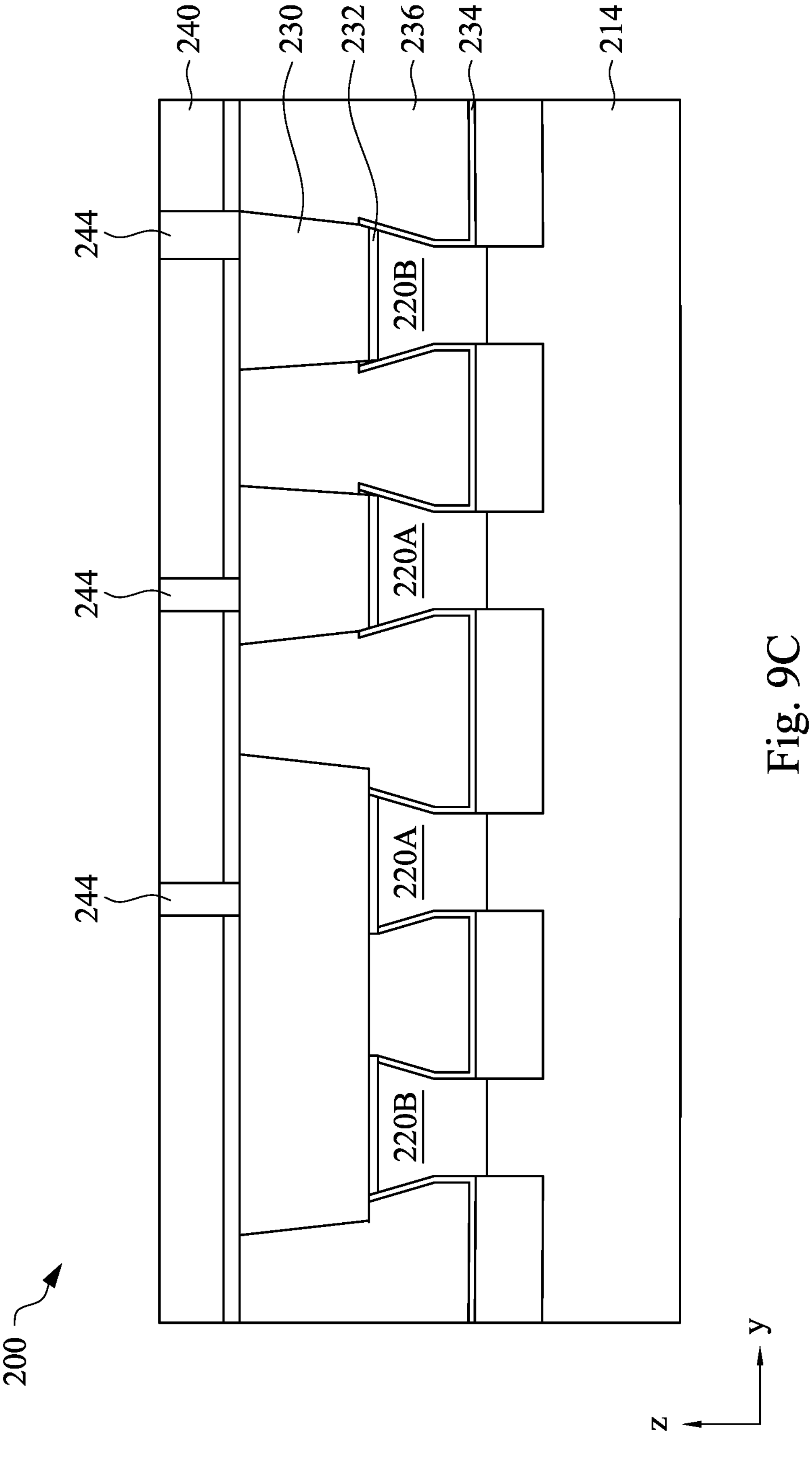

In operation 120, a planarization process may be performed is performed to remove the T-top of the gate electrode layer 226 and expose the sidewall spacers 212 as shown in FIGS. 9A-9C. FIG. 9A is a schematic cross sectional view along the C2 line in FIG. 1A. FIG. 9B is a schematic cross sectional view along the C1 line in FIG. 1A. FIG. 9B is a schematic cross sectional view along the C3 line in FIG. 1A. After planarization, the upper surface 230$t$ of the source/drain contacts 230 and an upper surface 226$t$ of the gate electrode 226 are co-planar. In some embodiments, the dielectric gate 204 may be formed by removing the gate structures 208.

In operation 122, the ILD layer 240 is deposited over and the gate vias 242 and contact vias 244 are formed therein, as shown in FIGS. 9A-9C. The gate vias 242 are electrically connected to the gate electrode 225. The contact vias 244 that are electrically connected to the source/drain contacts 230. Each of the gate vias 242 and source/drain contact vias 244 may include a conductive barrier layer and a metal fill layer over the conductive barrier layer.

Figure 10A:
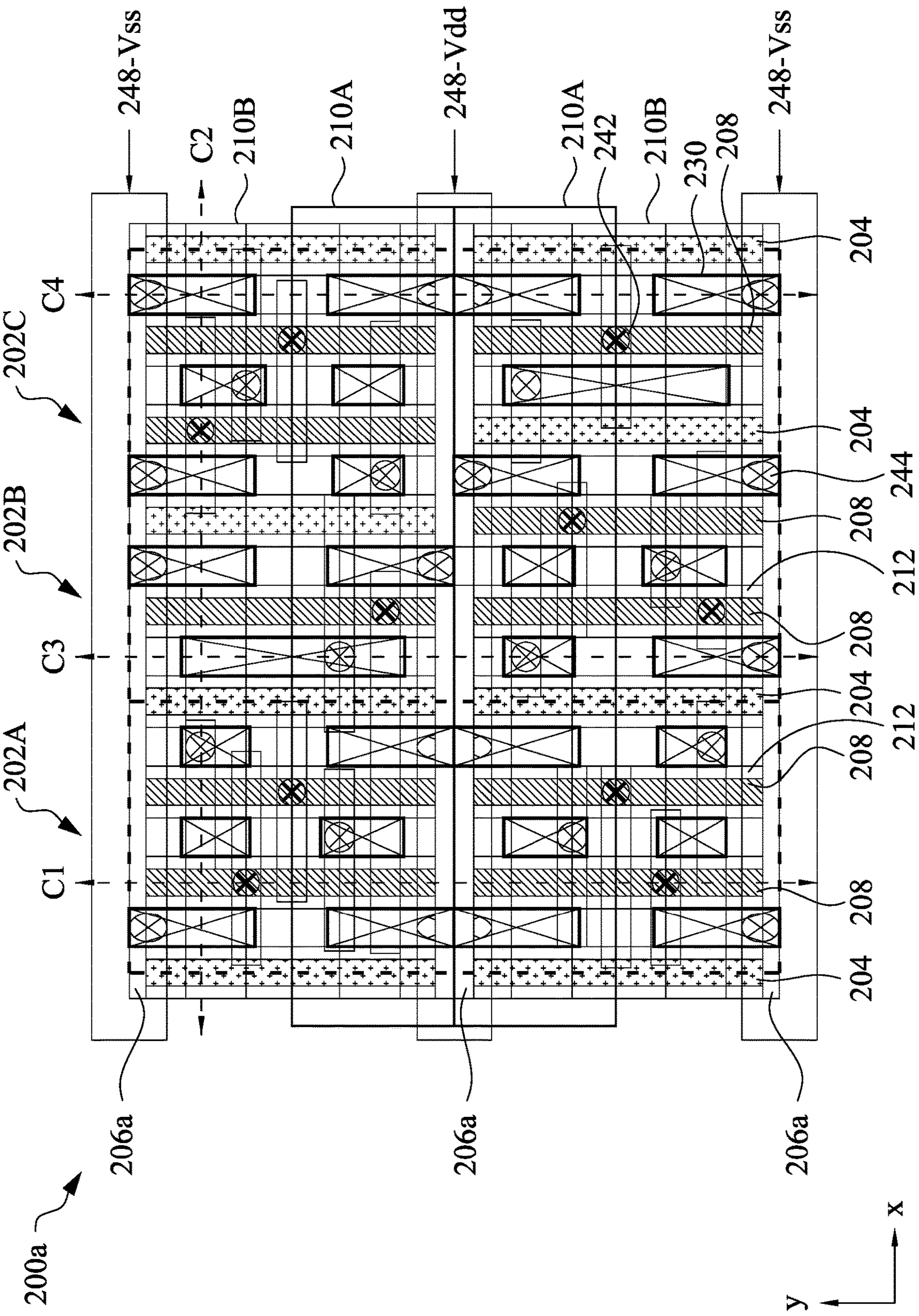
FIG. 10A-10D are schematic views of a semiconductor device according to embodiments of the present disclosure.
Figure 10B:
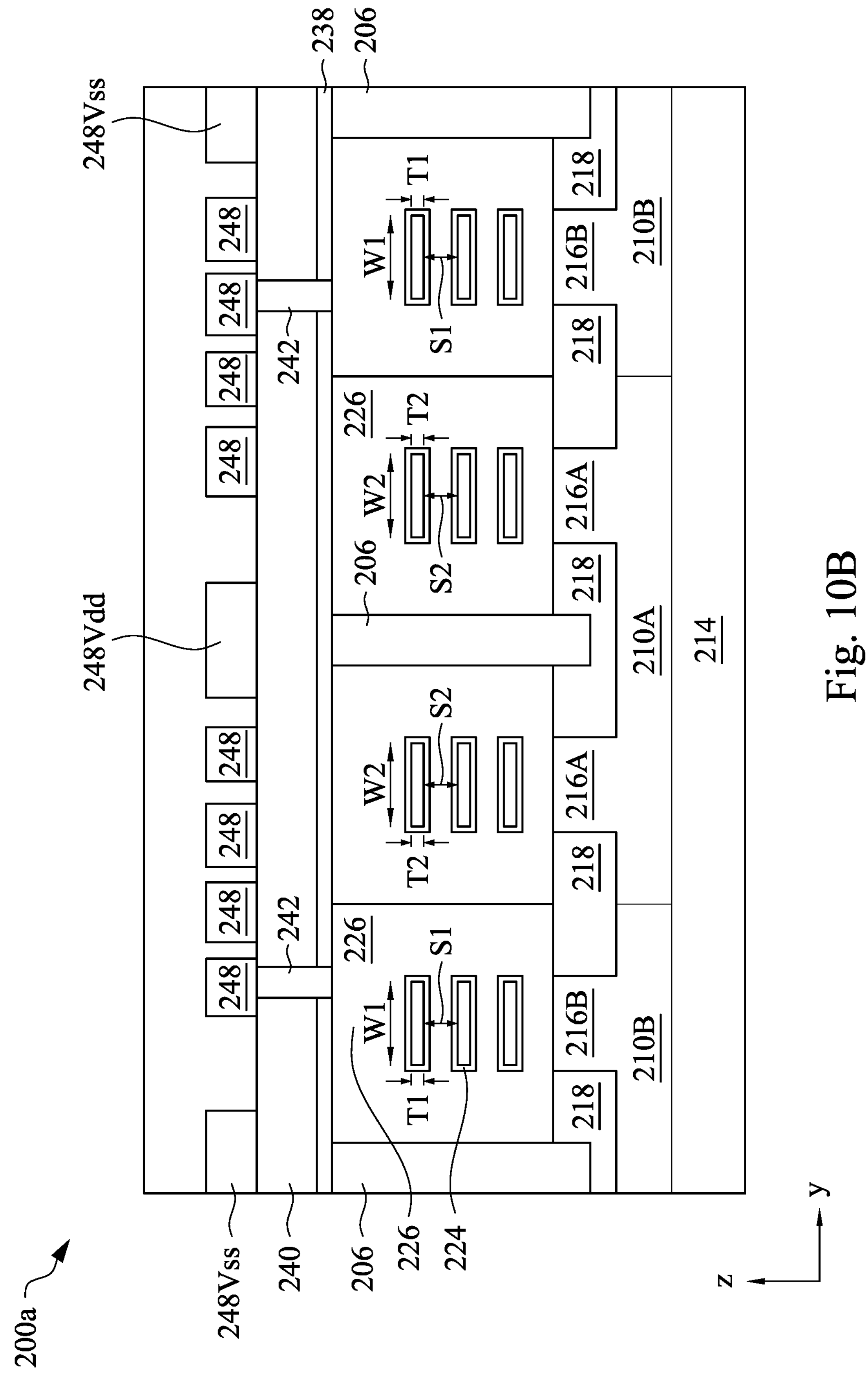
Figure 10C:
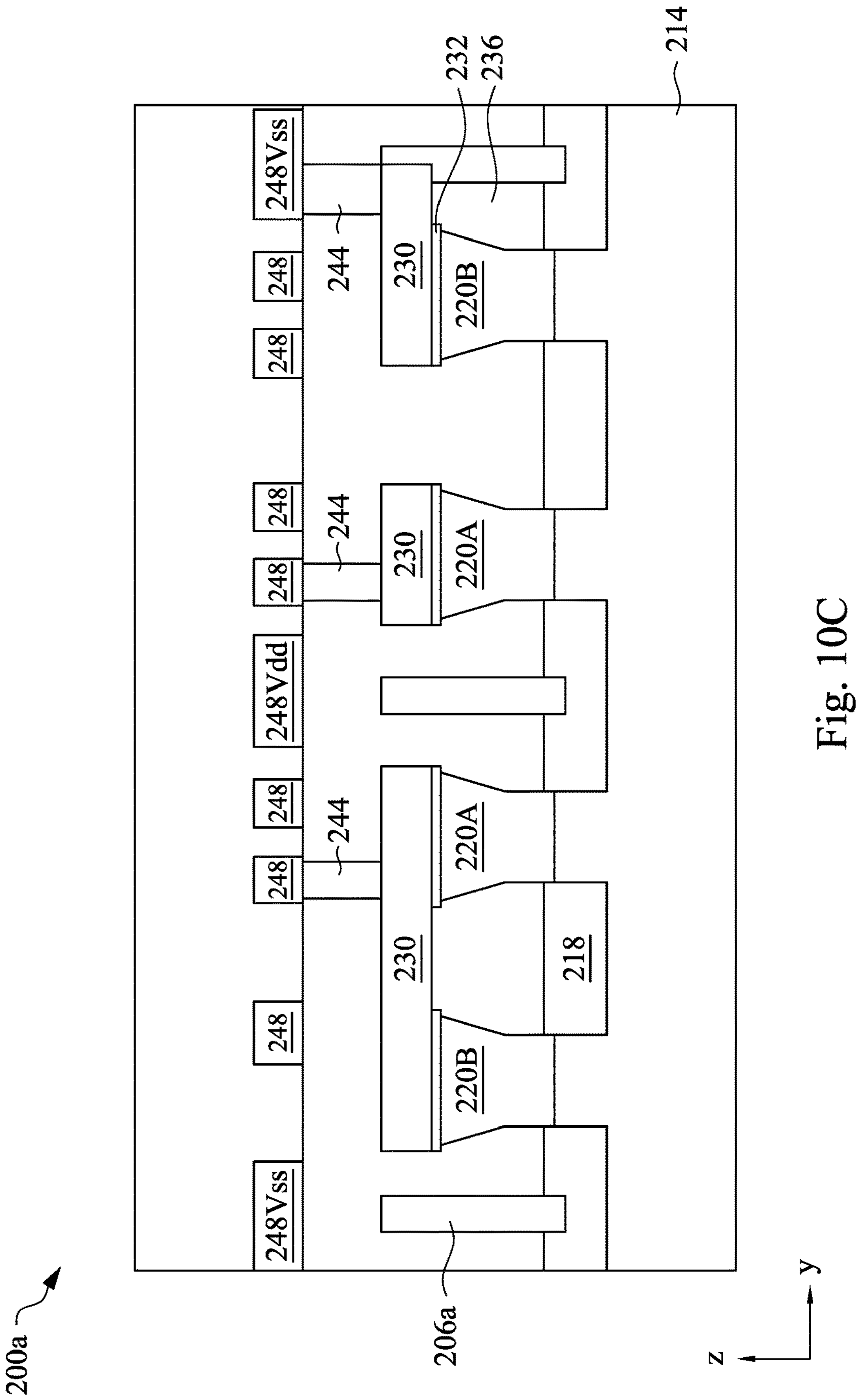
Figure 10D:
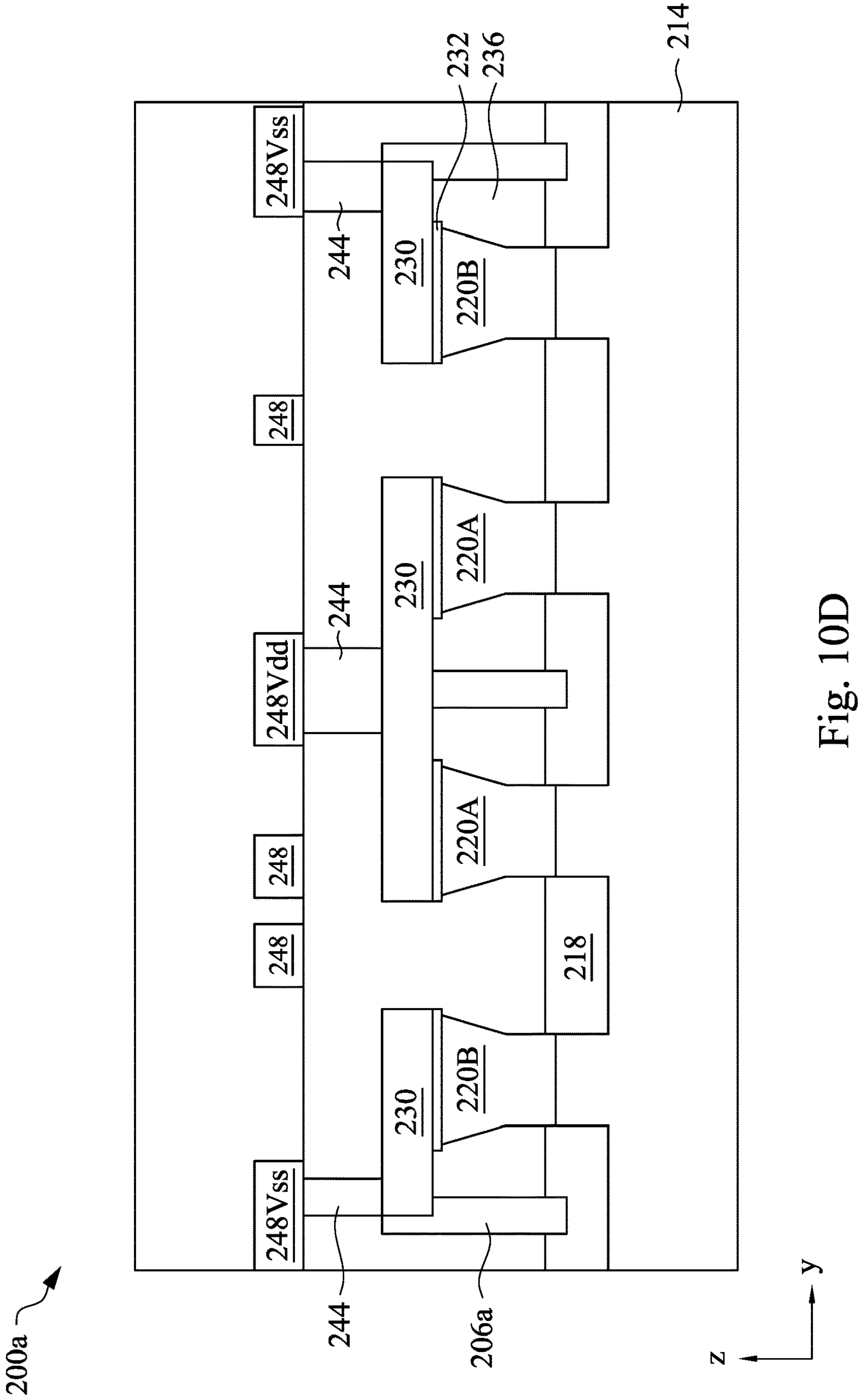

FIGS. 10A-10D are schematic views of a semiconductor device 200$a$ according to embodiments of the present disclosure. FIG. 10A is a schematic layout view of the semiconductor device 200$a$ according to embodiments of the present disclosure. FIGS. 10B, 10C, 10D are schematic cross-sectional views of the semiconductor device 200$a$ along the "C2" line, the "C1" line, the "C3" line in FIG. 10A respectively.

The semiconductor device 200$a$ is similar to the semiconductor device 200 except that the semiconductor device 200$a$ includes gate end dielectric features 206$a$ extending through the ILD layer 236. The gate end dielectric features 206*a* are formed prior to the source/drain contacts 230. The source/drain contacts 230 may formed over or cross the gate end dielectric features 206*a* to connect the source/drain regions 220 on opposite sides of the gate end dielectric features 206*a*.

Figure 11A:
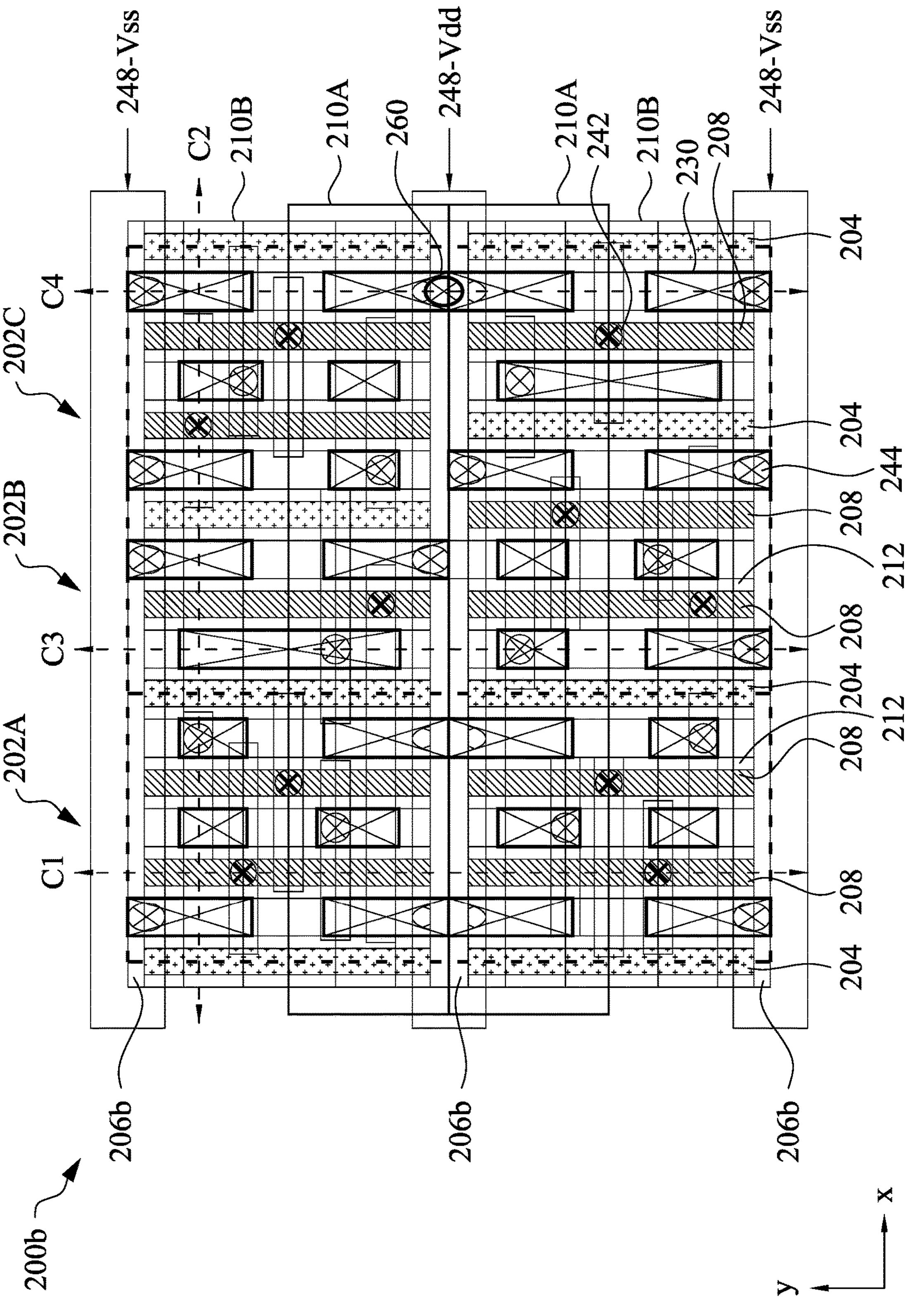
FIG. 11A-11D are schematic views of a semiconductor device according to embodiments of the present disclosure.
Figure 11B:
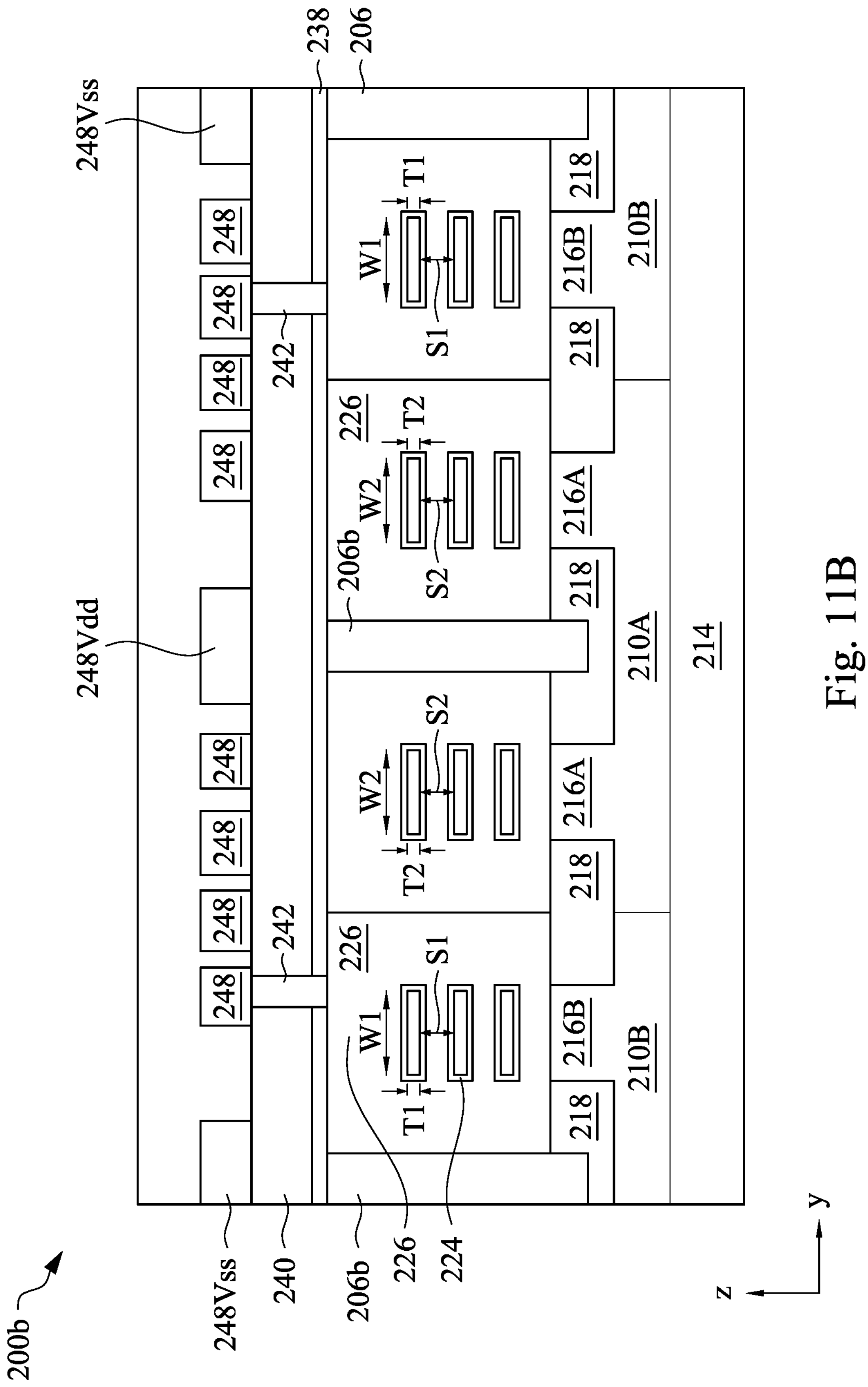
Figure 11C:
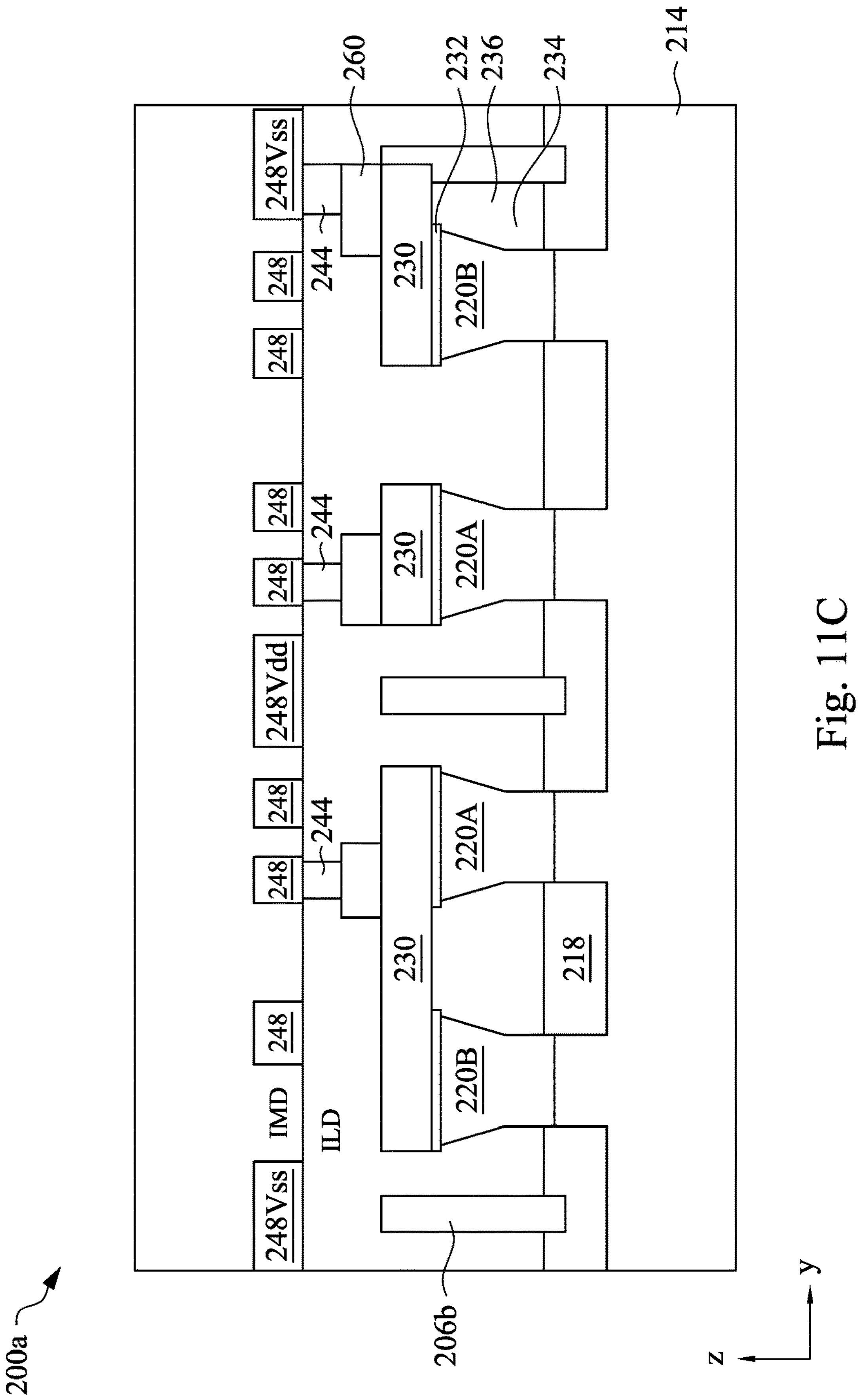
Figure 11D:
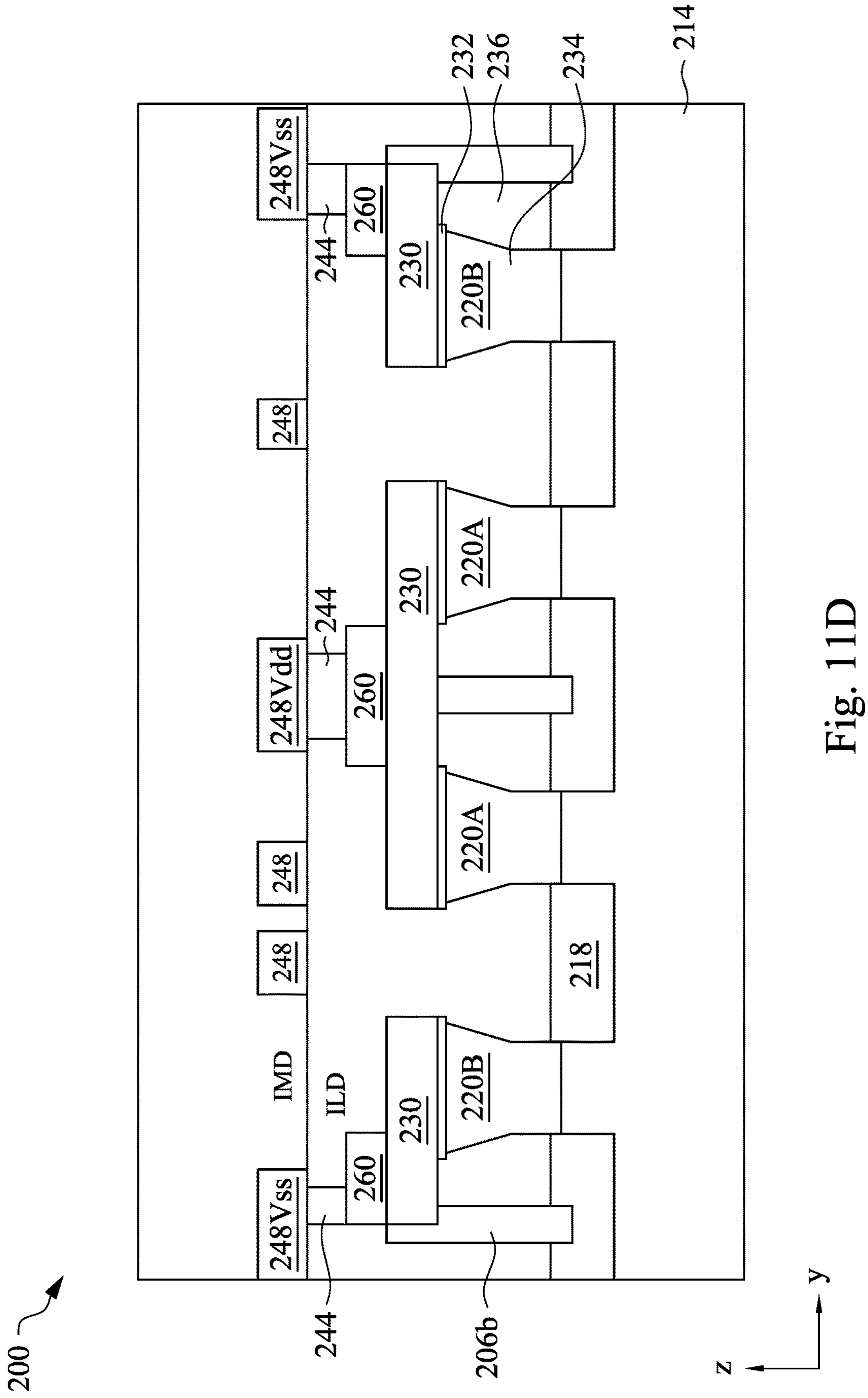

FIGS. 11A-11D are schematic views of a semiconductor device 200*b* according to embodiments of the present disclosure. FIG. 11A is a schematic layout view of the semiconductor device 200*b* according to embodiments of the present disclosure. FIGS. 11B, 11C, 11D are schematic cross-sectional views of the semiconductor device 200*b* along the "C2" line, the "C1" line, the "C3" line in FIG. 11A respectively.

The semiconductor device 200*b* is similar to the semiconductor device 200*a* except that the semiconductor device 200*b* includes gate end dielectric features 206*b* extending through the ILD layer 236. The gate end dielectric features 206*b* are formed after the source/drain contacts 230. The semiconductor device 200*b* further includes second level contacts 260 formed over the source/drain contacts 230. The second level contacts 260 is then connected to the source/drain contact vias 244. The second level contacts 260 may also connect the source/drain regions 220 on opposite sides of the gate end dielectric features 206*a*.

Figure 12A:
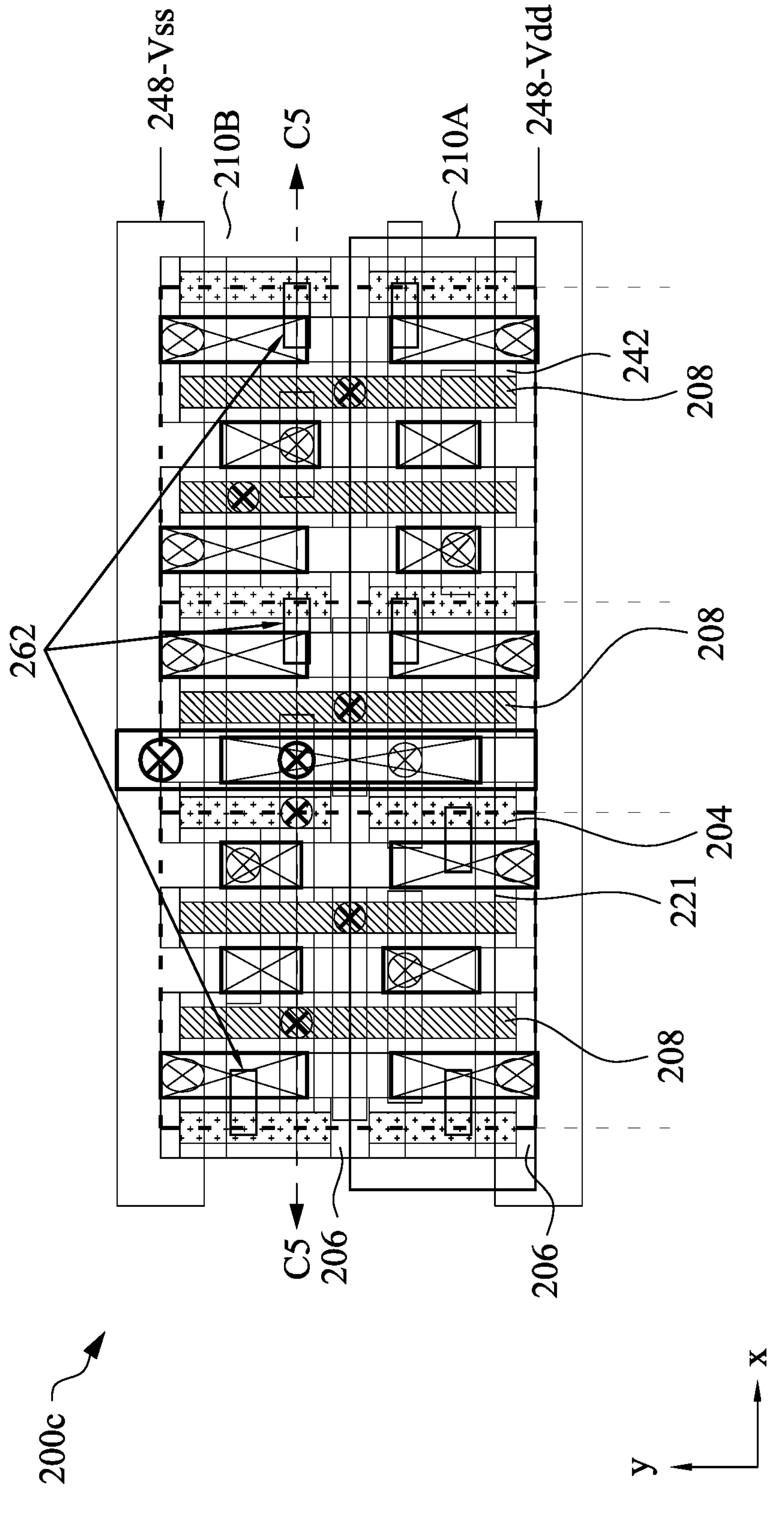
FIG. 12A-12B are schematic views of a semiconductor device according to embodiments of the present disclosure.
Figure 12B:
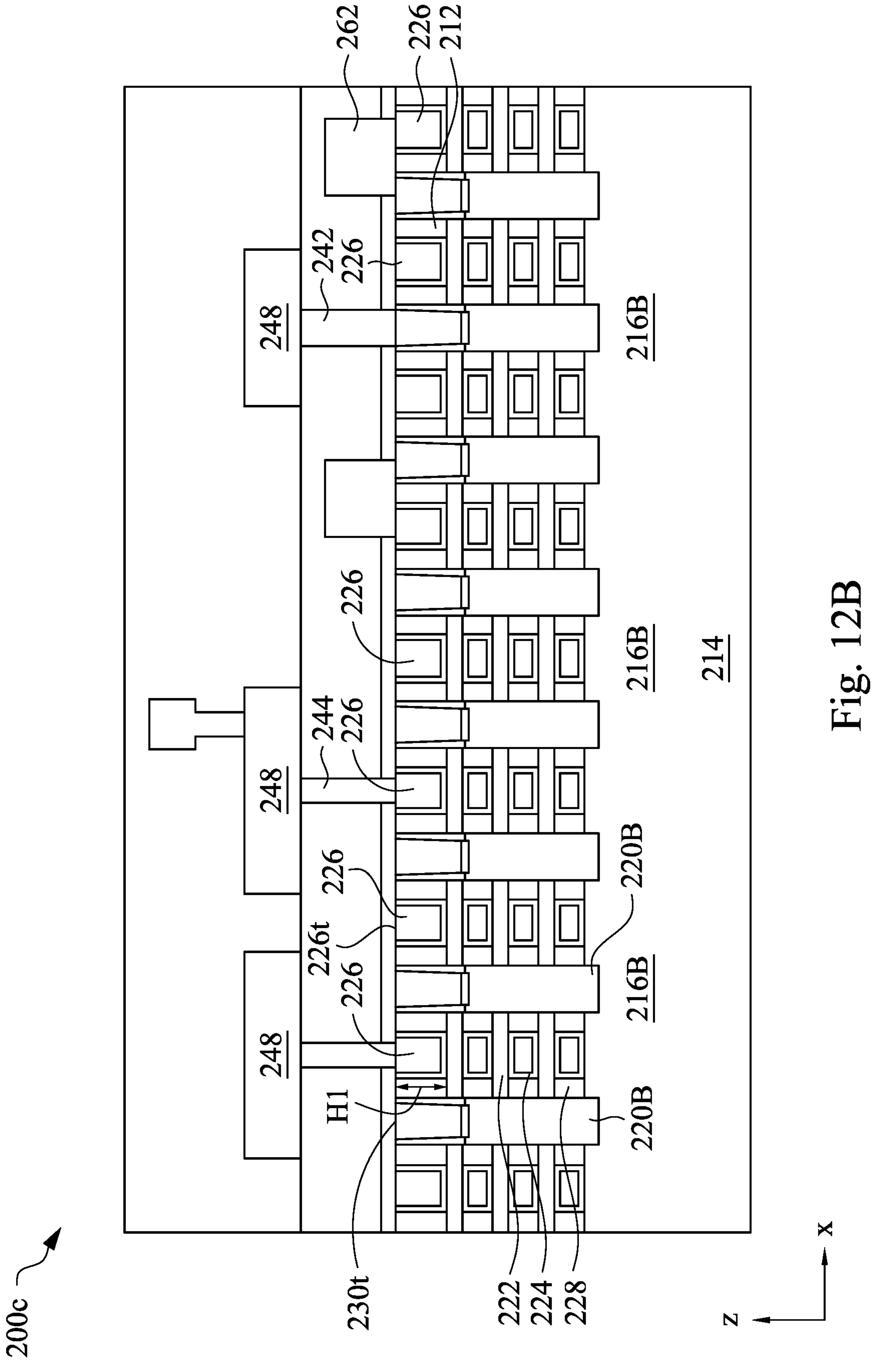

FIGS. 12A-12B are schematic views of a semiconductor device 200*c* according to embodiments of the present disclosure. FIG. 12A is a schematic layout view of the semiconductor device 200*c* according to embodiments of the present disclosure. FIG. 12B is a schematic cross-sectional view of the semiconductor device 200*c* along the "C5" line in FIG. 12A.

The semiconductor device 200*c* is similar to the semiconductor device 200*b* except that the semiconductor device 200*c* includes butt connections 262 formed in a dielectric layer above the source/drain contacts 230. The butt connections 262 electrically connect the gate electrode 226 and the source/drain contacts 230.

Embodiments of the present disclosure have various advantages. Semiconductor devices according to the present disclosure has contact landing Rc reduction at source/drain contacts as well as device performance improvement. The source/drain contacts formed according to the present disclosure also has lowered height leading to the capacitance reduction of between the source/drain contact to gate electrode. Embodiments of the present disclosure also provides improvements in circuit density and process margin. The self-aligned contact scheme according to the present disclosure allow more aggressive gate pitch (CPP) scaling and also maintain the landing area as well as contact-gate isolation margin.

Some embodiments provide a semiconductor device comprising: a first source/drain region; a second source/drain region; a gate structure disposed between the first and second source regions, wherein the gate structure includes: a semiconductor channel in contact with the first source/drain region; a gate dielectric layer disposed on the semiconductor channel; and a gate electrode layer disposed on the gate dielectric layer; a sidewall spacer disposed on the gate structure; a contact etch stop layer disposed on the sidewall spacer; and a first source/drain contact disposed on the first source/drain region, wherein a side surface of the first source/drain contact is in contact with the contact etch stop layer, and a top surface of the first source/drain contact and a top surface of the gate electrode layer is co-planar.

Some embodiments provide a semiconductor device comprising a first source/drain region; a second source/drain region; two or more channel layers disposed between the first and second source/drain regions; a gate dielectric layer disposed around the two or more channel layers; a gate electrode layer disposed on the gate dielectric layer, wherein the gate electrode layer has a first height from a top surface to a topmost channel layer; first and second sidewall spacers disposed the gate dielectric layer and the first and second source/drain regions; a contact etch stop layer disposed on the first and second sidewall spacers; and a first source/drain contact disposed on the first source/drain region, wherein the first source/drain contact has a second height, and the second height is greater than the first height.

Some embodiments provide a method comprising forming a fin structure along a first direction; forming a sacrificial gate structure along a second direction and across the fin structure; forming first and second sidewall spacers on opposing sidewalls of the sacrificial gate structure; forming first and second source/drain regions on opposing sidewalls of the sacrificial gate structure; depositing a contact etch stop layer over the first and second source/drain regions; depositing a first dielectric layer on the contact etch stop layer; forming a gate electrode layer; and forming first and second source/drain contacts on the first and second source/region regions, wherein a top surface of the gate electrode layer is coplanar with top surfaces of the first and second source/drain contacts.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
- forming a fin structure along a first direction;
- forming a sacrificial gate structure along a second direction and across the fin structure;
- forming first and second sidewall spacers on opposing sidewalls of the sacrificial gate structure;
- forming first and second source/drain regions on opposing sidewalls of the sacrificial gate structure;
- depositing a contact etch stop layer over the first and second source/drain regions;
- depositing a first dielectric layer on the contact etch stop layer;
- forming a gate electrode layer, wherein forming the gate electrode layer comprises:
  - etching back a portion of the first and second sidewall spacers,
  - removing the sacrificial gate structure, and
  - depositing a gate electrode material layer, wherein the gate electrode layer has a T-shape profile; and
- forming first and second source/drain contacts on the first and second source/region regions, wherein a top surface of the gate electrode layer is coplanar with top surfaces of the first and second source/drain contacts.

2. The method of claim 1, wherein forming the first and second source/drain contacts comprises:

forming first and second source/drain contact openings by etching the first dielectric layer using the gate electrode layer as a mask;

forming the first and second source/drain contacts in the first and second source/drain contact openings; and performing a planarization process to expose the first and second sidewall spacers.

3. The method of claim 2, further comprising:

forming a gate end dielectric feature, wherein the gate end dielectric feature is in contact with the first source/drain contact.

4. The method of claim 3, wherein the gate end dielectric feature extends into a shallow trench isolation layer.

5. The method of claim 1, further comprising:

forming a butt contact on the top surface of the gate electrode layer and the top surface of the first source/drain contact.

6. A method, comprising:

receiving a precursor structure comprising:

an active region comprising a channel region and a source/drain region, a gate structure disposed over the channel region and comprising a lower portion and an upper portion, wherein the gate structure comprises a gate dielectric layer and a gate electrode over the gate dielectric layer, the gate electrode comprises a titanium-containing material;

a gate spacer disposed along a sidewall of the lower portion of the gate structure, wherein the gate electrode in the upper portion of the gate structure extends over the gate spacer, a source/drain feature disposed over the source/drain region, a contact etch stop layer (CESL) disposed over the source/drain feature, and an interlayer dielectric (ILD) layer disposed over the CESL;

forming a mask over the precursor structure, the mask comprising an opening exposing the gate structure and a portion of the CESL and ILD layer over the source/drain feature;

selectively removing the exposed portion of the ILD layer; and forming a source/drain contact over the source/drain feature.

7. The method of claim 6, wherein the forming of the source/drain contact comprises:

after the selectively removing of the exposed portion of the ILD layer, depositing a conductive material over the precursor structure; and performing a planarization process to the precursor structure and the conductive material.

8. The method of claim 7, wherein the performing of the planarization process removes the upper portion of the gate structure.

9. The method of claim 7, wherein, after the performing of the planarization process, a top surface of the gate structure is coplanar with a top surface of the source/drain contact and a top surface of the gate spacer.

10. The method of claim 6, wherein the channel region comprises a plurality of nanostructures.

11. The method of claim 10, wherein the gate structure further comprises an inner portion wrapping around the plurality of nanostructures, and the precursor structure further comprises inner spacer features disposed between the inner portion of the gate structure and the source/drain feature.

12. The method of claim 11, wherein a dielectric constant of a material of the inner spacer features is greater than a dielectric constant of a material of the gate spacer.

13. The method of claim 6, further comprising:

forming a gate isolation structure configured to cut the gate structure into two segments, wherein a dielectric constant of a material of the gate isolation structure is greater than a dielectric constant of a material of the gate spacer.

14. A method, comprising:

forming a dummy gate stack over a channel region;

forming a gate spacer extending along a sidewall of the dummy gate stack;

forming a contact etch stop layer (CESL) adjacent to the gate spacer; and forming an interlayer dielectric (ILD) layer over the CESL;

after the forming of the ILD layer, removing an upper portion of the gate spacer to form a recess;

after the etching of the gate spacer, removing the dummy gate stack to form a trench;

forming a gate structure in the recess and the trench, the gate structure extending over the gate spacer; and forming a conductive feature extending through the ILD layer and the CESL.

15. The method of claim 14, further comprising:

forming a source/drain feature coupled to the channel region; and forming an isolation feature adjacent to a lower portion of the channel region.

16. The method of claim 15, wherein the ILD layer comprises a first portion over the source/drain feature and a second portion over the isolation feature, and wherein the forming of the conductive feature comprises:

forming a mask comprising an opening exposing the gate structure and the first portion of the ILD layer;

selectively removing the first portion of the ILD layer to expose the source/drain feature;

depositing a conductive material layer over the source/drain feature; and performing a planarization process to expose the gate spacer.

17. The method of claim 16, wherein the conductive material layer is vertically spaced apart from the gate spacer by the gate structure.

18. The method of claim 15, further comprising:

removing a portion of the CESL under the first portion of the ILD layer and on the source/drain feature.

19. The method of claim 14, wherein the channel region comprises a plurality of nanostructures.

20. The method of claim 13, wherein in a cross-sectional view, a portion of the source/drain contact laterally extends into the gate isolation structure.

* * * * *